United States Patent
Koyanagi

(10) Patent No.: US 7,265,402 B2
(45) Date of Patent: Sep. 4, 2007

(54) SOLID-STATE IMAGE SENSOR INCLUDING A MICROLENS

(75) Inventor: Mitsumasa Koyanagi, Natori (JP)

(73) Assignee: ZyCube Co., Ltd., Tokyo (JP)

( * ) Notice: Subject to any disclaimer, the term of this patent is extended or adjusted under 35 U.S.C. 154(b) by 286 days.

(21) Appl. No.: 10/494,264

(22) PCT Filed: Nov. 5, 2002

(86) PCT No.: PCT/JP02/11493

§ 371 (c)(1),
(2), (4) Date: Apr. 30, 2004

(87) PCT Pub. No.: WO03/041174

PCT Pub. Date: May 15, 2003

(65) Prior Publication Data

US 2005/0029643 A1  Feb. 10, 2005

(30) Foreign Application Priority Data

Nov. 5, 2001  (JP) .............................. 2001-340075

(51) Int. Cl.
H01L 31/062 (2006.01)
H01L 31/113 (2006.01)
(52) U.S. Cl. ................ 257/292; 257/294; 257/E33.073
(58) Field of Classification Search ................ 257/292, 257/294, E33.073
See application file for complete search history.

(56) References Cited

U.S. PATENT DOCUMENTS

| 5,481,124 A | 1/1996 | Kozuka et al. |
| 5,844,290 A | 12/1998 | Furumiya |
| 6,069,350 A | 5/2000 | Ohtsuka et al. |
| 6,285,064 B1 * | 9/2001 | Foster ........................ 257/433 |
| 7,110,034 B2 * | 9/2006 | Suda .......................... 348/340 |

FOREIGN PATENT DOCUMENTS

| EP | 0486318 A1 | 5/1992 |
| EP | 0570224 A2 | 11/1993 |
| EP | 0703619 A1 | 3/1996 |
| JP | 06-350068 | 12/1994 |
| JP | 09-218088 | 8/1997 |
| JP | 10-209414 | 8/1998 |
| JP | 2001-196374 A2 | 7/2001 |
| WO | WO99/45588 | 9/1999 |

OTHER PUBLICATIONS

International Search Report, completed Feb. 24, 2003.
Lee, Kang Wook et al, "Development of Three-Dimensional Integration Technology for Highly Parallel Image-Processing Chip", Jpn. J. Appl. Phys. vol. 39 pp. 2473-2477, Part I, No. 4B, Apr. 2000.
Kurino, H. et al, "Intelligent Image Sensor Chip with Three Dimensional Structure", Dept. of Machine Intelligence and Systems Engineering, Tohoku University, 1999 IEEE, 5 pages.
Office Action issued Sep. 21, 2006 in corresponding Taiwanese Patent Application. Translation of portions encased is attached herewith.

* cited by examiner

Primary Examiner—William M. Brewster
(74) Attorney, Agent, or Firm—Griffin & Szipl, P.C.

(57) ABSTRACT

A solid-state image sensor has a chip-size package, which can be easily fabricated. The element-formation regions are formed in the semiconductor substrate (21) of the light-receiving element layer (20) corresponding to the pixel regions. The semiconductor light-receiving elements (PD) are formed in the respective element-formation regions and covered with the light-transmissive insulator films (25a), (25b) and (26). The light-introducing layer (40), which includes the light-introducing cavity (42) and the quartz cap (51) for closing the cavity, is formed on the film (26). The microlenses (43) are incorporated into the cavity (42). The electric output signals of the semiconductor light-receiving elements (PD) are taken out to the bottom of the substrate (21) by way of the buried interconnections of the substrate (21) and then, derived to the outside of the image sensor by way of the output layer (10) or the interposer (10A).

19 Claims, 20 Drawing Sheets

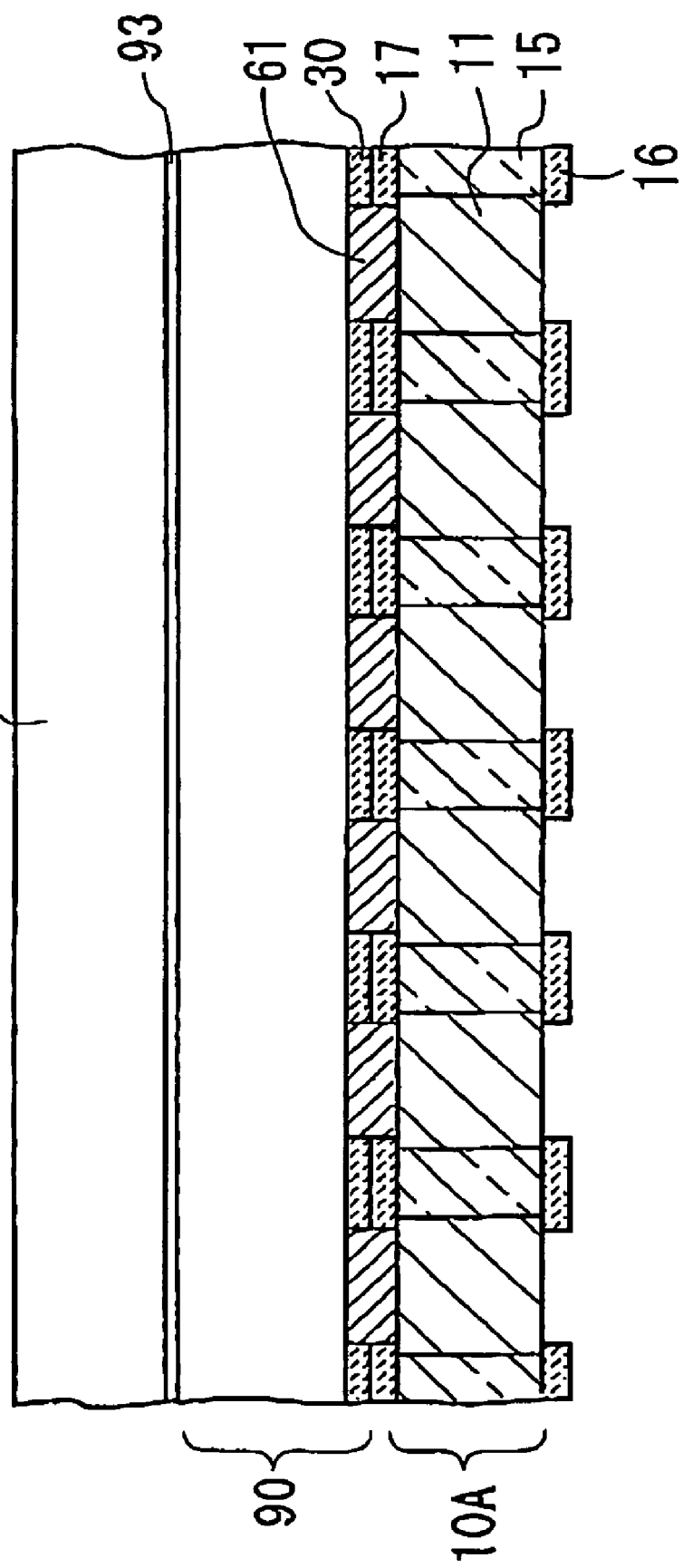

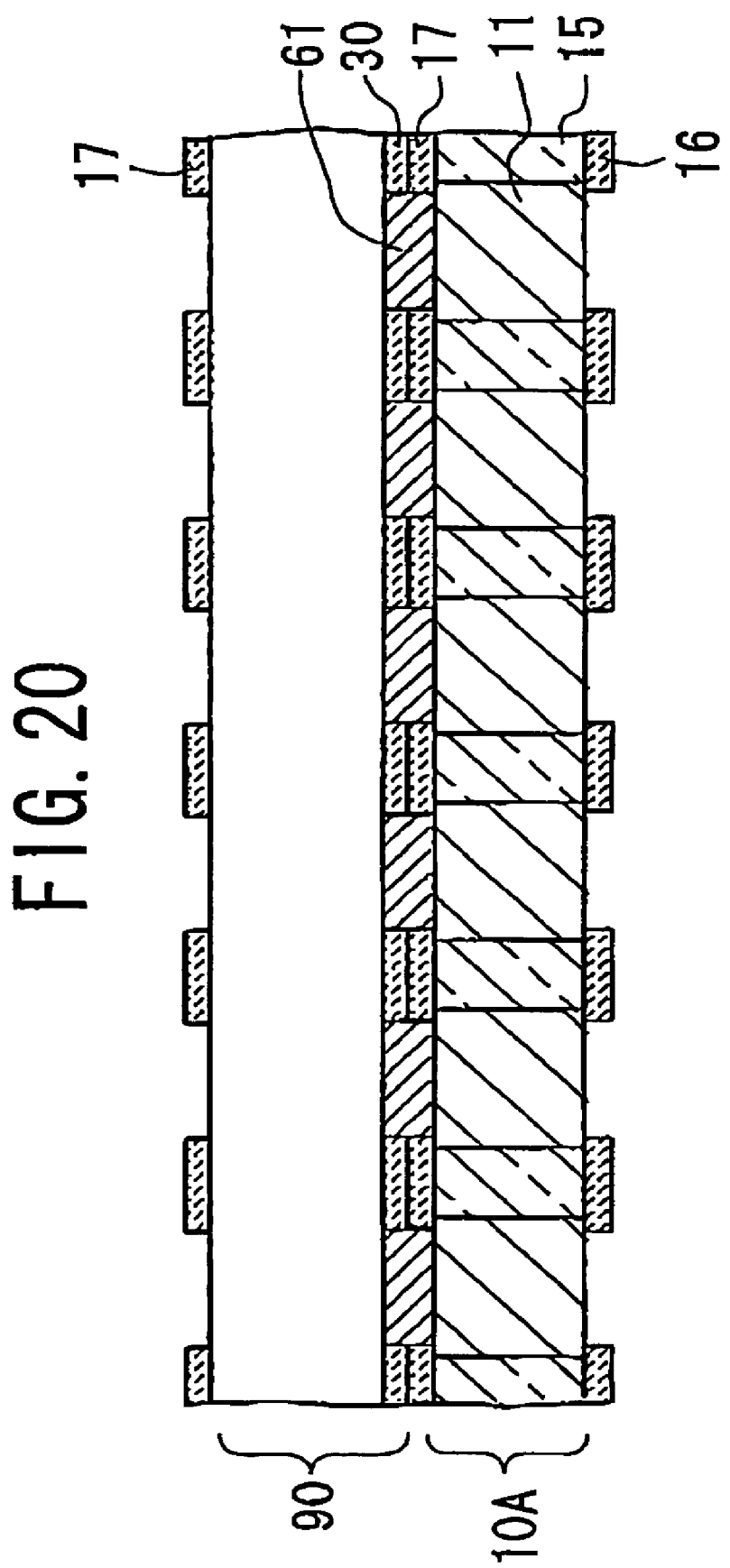

SOLID-STATE IMAGE SENSOR INCLUDING A MICROLENS

This is a National Phase Application in the United States of International Patent Application No. PCT/JP02/11493 filed Nov. 5, 2002, which claims priority on Japanese Patent Application No. 2001-340075, filed Nov. 5, 2001. The entire disclosures of the above patent applications are hereby incorporated by reference.

TECHNICAL FIELD

The present invention relates to a solid-state image sensor and a method of fabricating the same and more particularly, to a solid-state image sensor having microlenses arranged regularly and a method of fabricating the sensor.

BACKGROUND ART

Conventionally, solid-state image sensors have been frequently used in various solid-state image pickup apparatuses for capturing exterior image information and converting it to electric signals, such as digital cameras and facsimiles. Solid-state image sensors of this type are roughly divided into the so-called "line sensor" having pixel regions aligned in one direction (i.e., one-dimensionally) and the so-called "area sensors" having pixel regions arranged in an area (i.e., two-dimensionally). Conventional solid-state image sensors of this type generally have the following configuration.

Specifically, semiconductor light-receiving elements are regularly arranged corresponding to pixel regions. Light from an exterior image is separately received by the respective elements in the pixel regions and is converted to electric signals according to the intensity of the light. In other words, image information is photoelectrically converted by the elements in the respective pixels. Thereafter, the electric signals thus obtained are transferred to a predetermined signal processing circuit by a signal transfer circuit using Charge-Coupled Devices (CCDs) or shift registers, and is subjected to a predetermined signal processing in the signal-processing circuit, thereby reproducing the image. Additionally, as the semiconductor light-receiving elements, for example, photodiodes (PDs), phototransistors, or Metal-Oxide Semiconductor (MOS) capacitors are used.

Moreover, examining the packaging style of the conventional solid-state imaging sensors of this type, the semiconductor light-receiving elements, the signal transfer circuit and the signal processing circuit are formed in a semiconductor chip. The chip is mounted in a package having a window for introducing light. Light from an exterior image is temporarily taken in the package by way of the window and thereafter, is irradiated to the individual light-receiving elements in the chip by way of a light-introducing path or paths formed in the package. To shorten the light-introducing path(s) as much as possible, the elements in the chip are located near the window of the package.

On the other hand, in recent years, solid-state image sensors with a three-dimensional structure formed by stacking semiconductor chips were announced. For example, Kurino et al. announced "Intelligent Image Sensor Chip with Three-Dimensional Structure" in 1999 IEDM Technical Digest, pp. 36.4.1-36.4.4 published in 1999.

This image sensor chip has a four-layer structure, where a processor array and an output circuit are located in the first layer, data latches and masking circuits are located in the second layer, amplifiers and analog-to-digital converters are located in the third layer, and an image sensor array is located in the fourth layer. The uppermost surface of the image sensor array is covered with a quartz glass layer containing a microlens array. The microlens array is formed on the surface of the quartz glass layer. A photodiode is formed as the semiconductor light-receiving element in each image sensor of the image sensor array.

In addition, the respective layers constituting the four-layer structure are mechanically connected to each other with an adhesive, and are electrically connected to each other with buried interconnections using conductor plugs and microbump electrodes contacted with the interconnections.

Lee et al. announced "Development of Three-Dimensional Integration Technology for Highly Parallel Image-processing Chip" in Japan Journal of Applied Physics, Vol. 39, pp. 2474-2477, published in April 2000.

The image sensor chip of Lee et al. has approximately the same configuration as the solid-stage imaging sensor announced by Kurino et al. in the above-described treatise.

With the above-described conventional solid-state image sensors having a popular configuration, viewing from an aspect of configuration, exterior optical information is sensed by the light-receiving elements in the semiconductor chip by way of the window of the package, thereby obtaining the electric signals corresponding to the optical information. Thereafter, the electric signals are successively transferred to the signal processing circuit with the signal transfer circuit using CCDs or shift-registers. Therefore, time delay occurs from the reception of light by the light-receiving elements to the start of signal processing by the signal processing circuit and as a result, there is a problem that a sufficiently high operation speed (e.g., an operating frequency in the order of GHz) satisfying the recent demand of raising the signal processing rate is not obtainable. Moreover, there is another problem that the size of the solid-state image sensor is large because the package and the semiconductor chip are separately formed.

Viewing from an aspect of the fabrication process sequence, it is required that the package is formed separately from the semiconductor chip and then, the chip is mounted in the package. Thus, there is a problem that the fabrication process sequence is complicated.

Unlike this, with the solid-state image sensors disclosed in the above-described two treatises, the uppermost surface of the image sensor array is covered with the quartz glass layer, and the microlens array is formed on the said surface of the quartz glass layer. The necessary signal processing circuits (e.g., processors and amplifiers) are built in. Therefore, the problem about the operation speed in the above-described conventional image sensors is solvable.

However, there is a problem that formation of the microlens array on the surface of the quartz glass layer is not easy and that sophisticated technologies are required for realizing it. Furthermore, since a plurality of semiconductor chips are stacked to form the three-dimensional structure, simplification of the fabrication process sequence is required as well.

DISCLOSURE OF THE INVENTION

The present invention was created to solve the above-described problems and its object is to provide a solid-state image sensor with a so-called chip-size package that is fabricated easily without the need of extra sophisticated technologies, and a method of fabricating the sensor.

Another object of the present invention is to provide a solid-state image sensor that operates at a sufficiently high operation speed (e.g., an operating frequency in the order of GHz) satisfying the recent demand of raising the signal-processing rate, and a method of fabricating the image sensor.

Still another object of the present invention is to provide a solid-state image sensor into which various circuits such as amplifier circuits for electric input signals and signal processing circuits can be incorporated according to the necessity, and a method of fabricating the image sensor.

A further object of the present invention is to provide a high-speed, high-sensitivity, high-performance, microminiaturized solid-state image sensor, and a method of fabricating the image sensor.

The other objects not specifically mentioned here will become clear from the following description.

A solid-state image sensor according to a first aspect of the present invention, which includes pixel regions arranged regularly on its face, comprises:

(a) a light-receiving element layer including semiconductor light-receiving elements, which are arranged corresponding to the pixel regions, for generating electric signals according to light irradiated; and light-transmissive regions for enabling light to be irradiated to the semiconductor light-receiving elements;

(b) a light-introducing layer for introducing light to the semiconductor light-receiving elements of the light-receiving element layer by way of the light-transmissive regions; and (c) an output layer having output terminals for outputting the electric signals generated by the semiconductor light-receiving elements of the light-receiving element layer to the outside;

wherein the light-introducing layer includes (b-1) microlenses arranged on the light-transmissive regions of the light-receiving element layer corresponding to the pixel regions;

(b-2) a supporting wall, which is formed on or over the light-transmissive regions, for forming a cavity accommodating the microlenses; and (b-3) a light-transmissive cover fixed to the supporting wall to form the cavity;

and wherein the sensor is configured in such a way that external light introduced into the cavity by way of the cover is irradiated to the semiconductor light-receiving elements of the light-receiving element layer by way of the microlenses.

With the solid-state image sensor according to the first aspect of the invention, the light-receiving element layer, the light-introducing layer and the output layer are provided. The light-introducing layer includes the microlenses, the supporting wall, and the light-transmissive cover. The sensor is configured in such a way that external light introduced into the cavity by way of the cover is irradiated to the semiconductor light-receiving elements of the light-receiving element layer by way of the microlenses.

Thus, with the image sensor according to the first aspect of the invention, the light-introducing layer for introducing external light and the output layer for outputting the electric signals corresponding to the external light are coupled with the light-receiving element layer including the semiconductor light-receiving elements. Moreover, the light-introducing layer for introducing external light includes the cavity formed by the wall and the cover, and the microlenses accommodated in the cavity and therefore, the light-introducing layer carries out the function of a light-introducing package including the microlenses. Accordingly, it can be said that the image sensor according to the invention has a configuration that such the light-introducing package is unified with the light-receiving element layer and the output layer.

Furthermore, the microlenses, the supporting wall and the cavity of the light-introducing layer can be formed by known micro-fabrication techniques that have been used in semiconductor device fabrication and therefore, the light-introducing package including the microlenses can be miniaturized to a chip-size one. In other words, a chip-size light-introducing package can be formed on the image sensor according to the invention.

Regarding the fabrication method, the solid-state image sensor according to the first aspect of the invention has a configuration that the light-introducing package is unified with the light-receiving element layer and the output layer. Thus, the process step of forming a package separately from a semiconductor chip and that of mounting the chip in the package are unnecessary and as a result, the fabrication process sequence is simplified. In addition, since the microlenses are formed not on the surface of a quartz glass layer but on the light-transmissive regions (which are typically formed by an insulator film such as $SiO_2$) of the light-receiving element layer, extra sophisticated technologies that are used for forming the microlenses on the surface of a quartz glass layer are not required.

To fabricate the light-receiving element layer and the output layer, known stacking techniques that a plurality of semiconductor chips are stacked to form a three-dimensional structure (i.e., techniques for stacking and joining substrates together with an adhesive while making their positional alignment) can be used. Thus, if the light-receiving element layer and the output layer are respectively formed with semiconductor substrates and thereafter, they are stacked and unified together, the light-receiving element layer and the output layer are fabricated easily.

Accordingly, the solid-state image sensor according to the first aspect of the invention does not require extra sophisticated technologies in its fabrication, which is easily fabricated.

Viewing from an aspect of the operation speed, the microlenses of the light-introducing layer are located on the light-transmissive regions of the light-receiving element layer. Therefore, by locating the microlenses as close to the light-transmissive regions as possible, external light passing through the microlenses can be directly converted to electric signals with the semiconductor light-receiving elements. The electric signals can be directly outputted from the light-receiving element layer to the outside by way of the output layer. As a result, the wiring line length for the electric signals obtained by converting the external light can be extremely shortened. Additionally, it is unnecessary to sequentially transfer the electric signals with CCDs. Accordingly, a sufficiently high operation speed (e.g., an operating frequency in the order of GHz) satisfying the recent demand of raising the signal-processing rate is obtainable.

Viewing from an aspect of the function, with the image sensor according to the first aspect of the invention, various circuits such as amplifier circuits for input electric signals and a signal processing circuit can be easily incorporated into the light-receiving element layer and/or the output layer. Alternately, it is easily realizable that a signal-processing circuit layer including a desired signal processing circuit is separately constituted and thereafter, the signal-processing circuit layer is inserted between the light-receiving element layer and the output layer. As a result, various necessary circuits such as amplifier circuits for input electric signals and a signal processing circuit can be incorporated into the image sensor according to the first aspect of the invention according to the necessity.

As described above, with the solid-state image sensor according to the first aspect of the invention, a high-speed, high-sensitivity, high-performance, microminiaturized solid-state image sensor is obtainable.

In a preferred embodiment of the image sensor according to the first aspect of the invention, each microlens of the light-introducing layer is formed by a patterned, island-shaped light-transmissive film. This is because the fabrication process is simplified.

It is preferred that the microlenses are located on the surfaces of the light-transmissive regions of the light-receiving element layer. This is because the distance between the microlenses and the semiconductor light-receiving elements can be decreased.

It is preferred that the supporting wall of the light-introducing layer includes a rigid material fixed to the surfaces of the light-transmissive regions with an adhesive. As the rigid material, any rigid material may be used if it is made of a material such as semiconductor, ceramic, plastic, or metal and has a desired rigidity (i.e., supporting strength).

In another preferred embodiment of the image sensor according to the first aspect of the invention, the light-receiving element layer, or the output layer, or the interposer includes at least one semiconductor element that deals with the electric signals generated by the light-receiving elements. In this embodiment, there is an advantage that the electric signals generated by the light-receiving elements are outputted after applying a desired processing to them.

In still another preferred embodiment of the image sensor according to the first aspect of the invention, at least one of a photodiode, a phototransistor, and a MOS transistor is included as the light-receiving element of the light-receiving element layer.

In a further preferred embodiment of the image sensor according to the first aspect of the invention, the output layer or the interposer has interconnections buried in a semiconductor substrate. The electric signals generated by the semiconductor light-receiving elements of the light-receiving element layer are sent to the output terminals of the output layer or the interposer by way of the buried interconnections.

In a further preferred embodiment of the image sensor according to the first aspect of the invention, the light-transmissive regions of the light-receiving element layer are formed by an insulating film, or an insulating film and a semiconductor substrate.

In a further preferred embodiment of the image sensor according to the first aspect of the invention, a signal-processing layer is provided between the light-receiving element layer and the output layer or the interposer, where the signal-processing layer includes a signal processing circuit for applying a predetermined signal processing to the electric signals generated by the semiconductor light-receiving elements.

Additionally, in the image sensor according to the first aspect of the invention, the light-transmissive cover may have any structure if it has a light-transmissive property and it is fixed to the supporting wall to form the cavity. The cover may be structured to have any shape such as a cap-like shape.

A method of fabricating a solid-state image sensor according to a second aspect of the invention, which includes pixel regions arranged regularly on its face, comprises the steps of:

(a) forming a light-receiving element layer;
  the light-receiving element layer including semiconductor light-receiving elements, which are arranged corresponding to the pixel regions, for generating electric signals according to light irradiated; and
  light-transmissive regions for enabling light to be irradiated to the semiconductor light-receiving elements;

(b) forming a light-introducing layer for introducing light to the semiconductor light-receiving elements of the light-receiving element layer by way of the light-transmissive regions; and (c) forming an output layer or an interposer;
  the output layer or the interposer having output terminals for outputting the electric signals generated by the semiconductor light-receiving elements of the light-receiving element layer to the outside;
  wherein the step (b) of forming the light-introducing layer comprises (b-1) a step of forming microlenses arranged on the light-transmissive regions of the light-receiving element layer corresponding to the pixel regions;

(b-2) a step of forming a supporting wall, on the light-transmissive regions, for forming a cavity accommodating the microlenses; and (b-3) a step of fixing a light-transmissive cover to the supporting wall to form the cavity, thereby irradiating external light introduced into the cavity by way of the cover to the semiconductor light-receiving elements of the light-receiving element layer by way of the microlenses.

With the method of fabricating a solid-state image sensor according to the second aspect of the invention, in the step (a), the light-receiving element layer is formed, where the light-receiving element layer includes the semiconductor light-receiving elements, and the light-transmissive regions for enabling light to be irradiated to the semiconductor light-receiving elements. In the step (b), the light-introducing layer for introducing light to the semiconductor light-receiving elements of the light-receiving element layer by way of the light-transmissive regions is formed. In the step (c), the output layer or the interposer is formed, where the output layer or the interposer has the output terminals for outputting the electric signals generated by the semiconductor light-receiving elements of the light-receiving element layer to the outside.

Moreover, in the step (b) of forming the light-introducing layer, the step (b-1) of forming the microlenses arranged on the light-transmissive regions of the light-receiving element layer corresponding to the pixel regions; the step (b-2) of forming the supporting wall, on the light-transmissive regions, for forming the cavity accommodating the microlenses: and the step (b-3) of fixing the light-transmissive cover to the supporting wall to form the cavity, thereby irradiating external light introduced into the cavity by way of the cover to the light-receiving elements of the light-receiving element layer by way of the microlenses are carried out.

Accordingly, it is apparent that the above-described solid-state image sensor according to the first aspect of the invention is fabricated.

In a preferred embodiment of the method according to the second aspect of the invention, a light-transmissive film for lenses is formed on the light-transmissive regions of the light-receiving element layer, the light-transmissive film is patterned by a lithography method to form island-shaped parts of the film, and the island-shaped parts are subjected to heat treatment to curve their surfaces, resulting in the microlenses. In this embodiment, the light-transmissive film for lenses is preferably made of an organic material.

In another preferred embodiment of the method according to the second aspect of the invention, a light-transmissive film for lenses is formed on the light-transmissive regions of the light-receiving element layer, a mask is formed on the light-transmissive film, and the light-transmissive film is etched to form island-shaped parts using the mask, resulting in the microlenses. In this embodiment, the light-transmissive film for lenses is preferably made of an inorganic material The surface of each island-shaped part may be or may not be curved.

In still another preferred embodiment of the method according to the second aspect of the invention, the supporting wall of the light-introducing layer is formed by adhering a rigid plate on the light-transmissive regions of the light-receiving element layer to cover the microlenses, and by etching the rigid plate to expose the microlenses. In this case, it is preferred that a step of forming a film serving as an etch stop when the rigid plate is etched between the microlenses and the rigid plate. The film serving as an etch stop may be left if it has a sufficient light-transmissive property. However, it is preferred that the film serving as an etch stop is removed by etching after the etching of the rigid plate is completed.

Any plate such as a metal plate, glass plate, plastic plate, ceramic plate, or semiconductor plate, may be used as the rigid plate if it is has rigidity and desired strength (and desired processibility).

In a further preferred embodiment of the method according to the second aspect of the invention, after the step (c), a step (d) of mechanically connecting the output layer or the interposer and the light-receiving element layer directly or by way of another layer, and of electrically connecting the output terminals of the output layer or the interposer and paths for the electric signals generated by the semiconductor light-receiving elements, is carried out.

In addition, in the method according to the second aspect of the invention also, the structure of the cover may be optional if it has a light-transmissive property and is fixed to the supporting wall to form the cavity. The cover may have any structure such as a cap-shaped one.

A solid-state image sensor according to a third aspect of the present invention, which includes pixel regions arranged regularly on its face, comprises:

(a) a light-receiving element layer including semiconductor light-receiving elements, which are arranged corresponding to the pixel regions, for generating electric signals according to light irradiated; and light-transmissive regions for enabling light to be irradiated to the semiconductor light-receiving elements;

(b) a light-introducing layer for introducing light to the semiconductor light-receiving elements of the light-receiving element layer by way of the light-transmissive regions; and (c) an output layer or interposer having output terminals for outputting the electric signals generated by the semiconductor light-receiving elements of the light-receiving element layer to the outside;

wherein the light-introducing layer includes (b-1) a light-transmissive body; and (b-2) microlenses formed in the body to be unified with the same and arranged on the light-transmissive regions of the light-receiving element layer corresponding to the pixel regions:

and wherein the sensor is configured in such a way that external light introduced into the inside of the body is irradiated to the semiconductor light-receiving elements of the light-receiving element layer by way of the microlenses.

With the solid-state image sensor according to the third aspect of the invention, the light-receiving element layer, the light-introducing layer, and the output layer are provided. The light-introducing layer includes the microlenses formed in the body to be unified with the same. The sensor is configured in such a way that external light introduced into the inside of the body is irradiated to the semiconductor light-receiving elements of the light-receiving element layer by way of the microlenses.

Thus, with the image sensor according to the third aspect of the invention, the light-introducing layer for introducing external light and the output layer or the interposer for outputting the electric signals corresponding to the external light are coupled with the light-receiving element layer including the light-receiving elements. Moreover, the light-introducing layer for introducing external light includes the microlenses and therefore, the light-introducing layer carries out the function of a light-introducing package having the microlenses. Accordingly, it can be said that the image sensor according to the invention has a configuration that such the light-introducing package is unified with the light-receiving element layer and the output layer or the interposer.

Furthermore, the microlenses of the light-introducing layer can be formed by known micro-fabrication techniques that have been used in semiconductor device fabrication and therefore, the light-introducing package including the microlenses can be miniaturized to a chip-size one. In other words, a chip-size light-introducing package can be made on the image sensor according to the invention.

Viewing from an aspect of the fabrication method, the image sensor according to the third aspect of the invention has a configuration that the package for introducing light is unified with the light-receiving element layer and the output layer or the interposer. Thus, the process step of forming a package separately from a semiconductor chip and that of mounting the chip in the package are unnecessary and as a result, the fabrication process sequence is simplified. In addition, since the microlenses are formed not on the surface of a quartz glass layer but in the light-transmissive body, extra sophisticated technologies that are used for forming the microlenses on the surface of a quartz glass layer are not required.

To form the light-receiving element layer and the output layer or the interposer, known stacking techniques that a plurality of semiconductor chips are stacked to form a three-dimensional structure (i.e., techniques for stacking and joining substrates together with an adhesive while making their positional alignment) can be used. Thus, if the light-receiving element layer and the output layer or the interposer are respectively formed with semiconductor substrates and thereafter, they are stacked and unified together, the light-receiving element layer and the output layer or the interposer are easily fabricated.

Accordingly, the solid-state image sensor according to the third aspect of the invention does not require extra sophisticated technologies in its fabrication, which is easily fabricated.

Viewing from an aspect of the operation speed, the microlenses of the light-introducing layer are arranged on the light-transmissive regions of the light-receiving element layer. Therefore, by locating the microlenses as close to the light-transmissive regions as possible, external light passing through the microlenses can be directly converted to electric signals with the semiconductor light-receiving elements. The electric signals can be directly outputted from the light-receiving element layer to the outside by way of the output layer or the interposer. As a result, the wiring line length for the electric signals obtained by converting the external light can be extremely shortened. Additionally, it is unnecessary to transfer the electric signals sequentially with CCDs. Accordingly, a sufficiently high operation speed (e.g., an operating frequency in the order of GHz) satisfying the recent demand of raising the signal-processing rate is obtainable.

Viewing from an aspect of the function, with the image sensor according to the third aspect of the invention, various circuits such as amplifier circuits for electric input signals and a signal processing circuit can be incorporated into the light-receiving element layer and/or the output layer or the interposer. Alternately, it is easily realizable that a signal-processing circuit layer including a desired signal processing circuit is separately constituted and thereafter, the signal-processing circuit layer is inserted between the light-receiving element layer and the output layer of the interposer. As a result, various circuits such as amplifier circuits for electric input signals and a signal processing circuit can be incorporated into the image sensor according to the third aspect of the invention according to the necessity.

As described above, with the image sensor according to the third aspect of the invention, similar to the image sensor according to the first aspect of the invention, a high-speed, high-sensitivity, high-performance, microminiaturized solid-state image sensor is obtainable.

In a preferred embodiment of the image sensor according to the third aspect of the invention, the microlenses are arranged on the surfaces of the light-transmissive regions of the light-receiving element layer. This is because the distance between the microlenses and the light-receiving elements can be decreased.

In another preferred embodiment of the image sensor according to the third aspect of the invention, the light-receiving element layer, or the output layer, or the interposer includes at least one semiconductor element that deals with the electric signals generated by the light-receiving elements. In this embodiment, there is an advantage that the electric signals generated by the light-receiving elements are outputted after applying a desired processing to them.

In still another preferred embodiment of the image sensor according to the third aspect of the invention, at least one of a photodiode, a phototransistor, and a MOS transistor is included as the light-receiving element of the light-receiving element layer.

In a further preferred embodiment of the image sensor according to the third aspect of the invention, the output layer or the interposer has interconnections buried in a semiconductor substrate. The electric signals generated by the semiconductor light-receiving elements of the light-receiving element layer are sent to the output terminals of the output layer or the interposer by way of the buried interconnections.

In a further preferred embodiment of the image sensor according to the third aspect of the invention, the light-transmissive regions of the light-receiving element layer are formed by an insulating film, or an insulating film and a semiconductor substrate.

In a further preferred embodiment of the image sensor according to the third aspect of the invention, a signal-processing layer is provided between the light-receiving element layer and the output layer or the interposer, where the signal-processing layer includes a signal processing circuit for applying a predetermined signal processing to the electric signals generated by the semiconductor light-receiving elements.

A method of fabricating a solid-state image sensor according to a fourth aspect of the invention, which includes pixel regions arranged regularly on its face, comprises the steps of:

(a) forming a light-receiving element layer;
the light-receiving element layer including semiconductor light-receiving elements, which are arranged corresponding to the pixel regions, for generating electric signals according to light irradiated; and
light-transmissive regions for enabling light to be irradiated to the semiconductor light-receiving elements;

(b) forming a light-introducing layer for introducing light to the semiconductor light-receiving elements of the light-receiving element layer by way of the light-transmissive regions, the light-introducing layer including microlenses formed in a light-transmissive body to be unified with the same;

(c) forming an output layer or an interposer:
the output layer or the interposer having output terminals for outputting the electric signals generated by the semiconductor light-receiving elements of the light-receiving element layer to the outside;

(d) mechanically connecting the light-receiving element layer formed in the step (a) and the light-introducing layer formed in the step (b), thereby enabling external light introduced into the light-introducing layer to be irradiated to the light-receiving elements of the light-receiving element layer by way of the microlenses; and (e) mechanically connecting the output layer or the interposer formed in the step (c) and the light-introducing layer formed in the step (b) directly or by way of another layer and electrically connecting the output terminals of the output layer or the interposer and paths for the electric signals generated by the semiconductor light-receiving elements.

With the method of fabricating a semiconductor device according to the fourth aspect of the invention, in the step (a), the light-receiving element layer is formed, where the light-receiving element layer includes the semiconductor light-receiving elements, and the light-transmissive regions for enabling light to be irradiated to the semiconductor light-receiving elements. In the step (b), the light-introducing layer for introducing light to the semiconductor light-receiving elements of the light-receiving element layer by way of the light-transmissive regions is formed. In the step (c), the output layer or the interposer is formed, where the output layer or the interposer has the output terminals for outputting the electric signals generated by the semiconductor light-receiving elements of the light-receiving element layer to the outside.

Moreover, in the step (d), the light-receiving element layer formed in the step (a) and the light-introducing layer formed in the step (b) are mechanically connected, thereby enabling external light introduced into the light-introducing layer to be irradiated to the light-receiving elements of the light-receiving element layer by way of the microlenses. In the step (e), the output layer or the interposer formed in the step (c) and the light-introducing layer formed in the step (b) are mechanically connected directly or by way of another layer, and the output terminals of the output layer or the interposer and paths for electric signals generated by the semiconductor light-receiving elements are electrically connected.

Accordingly, it is apparent that the above-described solid-state image sensor according to the third aspect of the invention is fabricated.

In a preferred embodiment of the method according to the fourth aspect of the invention, in the step (b) of forming the light-introducing layer, the microlenses are formed by forming lens regions with a different refractive index at desired positions of the body.

BRIEF DESCRIPTION OF THE DRAWINGS

FIG. 19 is a view showing the process steps of another method of fabricating the solid-stage image sensor according to the fourth embodiment of FIG. 16.

FIG. 20 is a view showing the process steps of the method of fabricating the image sensor according to the fourth embodiment of FIG. 16, which is subsequent to the step of FIG. 19.

BEST MODE FOR CARRYING OUT THE INVENTION

Figure 1:
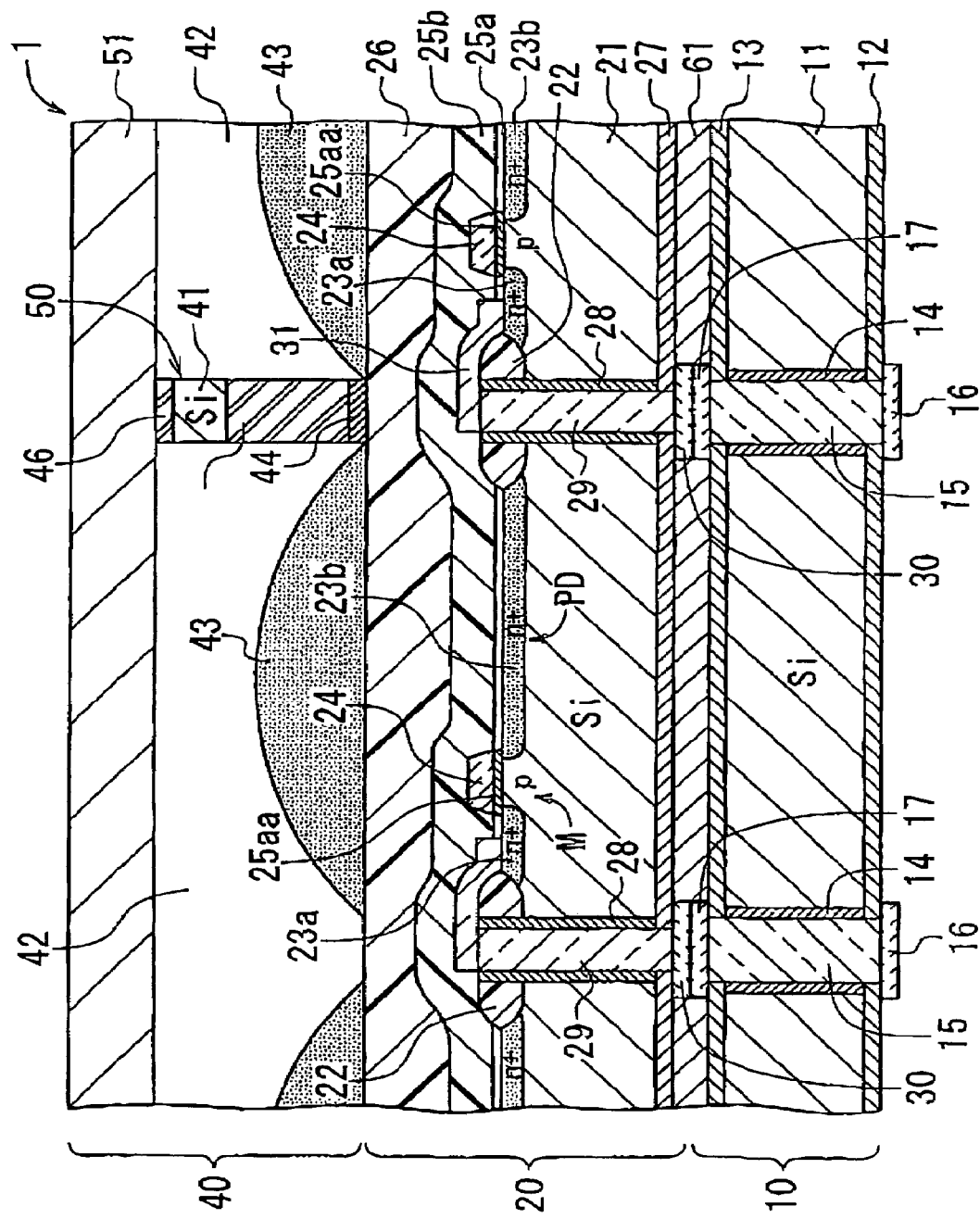
FIG. 1 is an enlarged cross-sectional view of a main part of a solid-stage image sensor according to a first embodiment of the invention, which shows the configuration thereof.

Preferred embodiments of the present invention will be described below while referring to the drawings attached.

First Embodiment

Configuration of Solid-State Image Sensor

Figure 2:
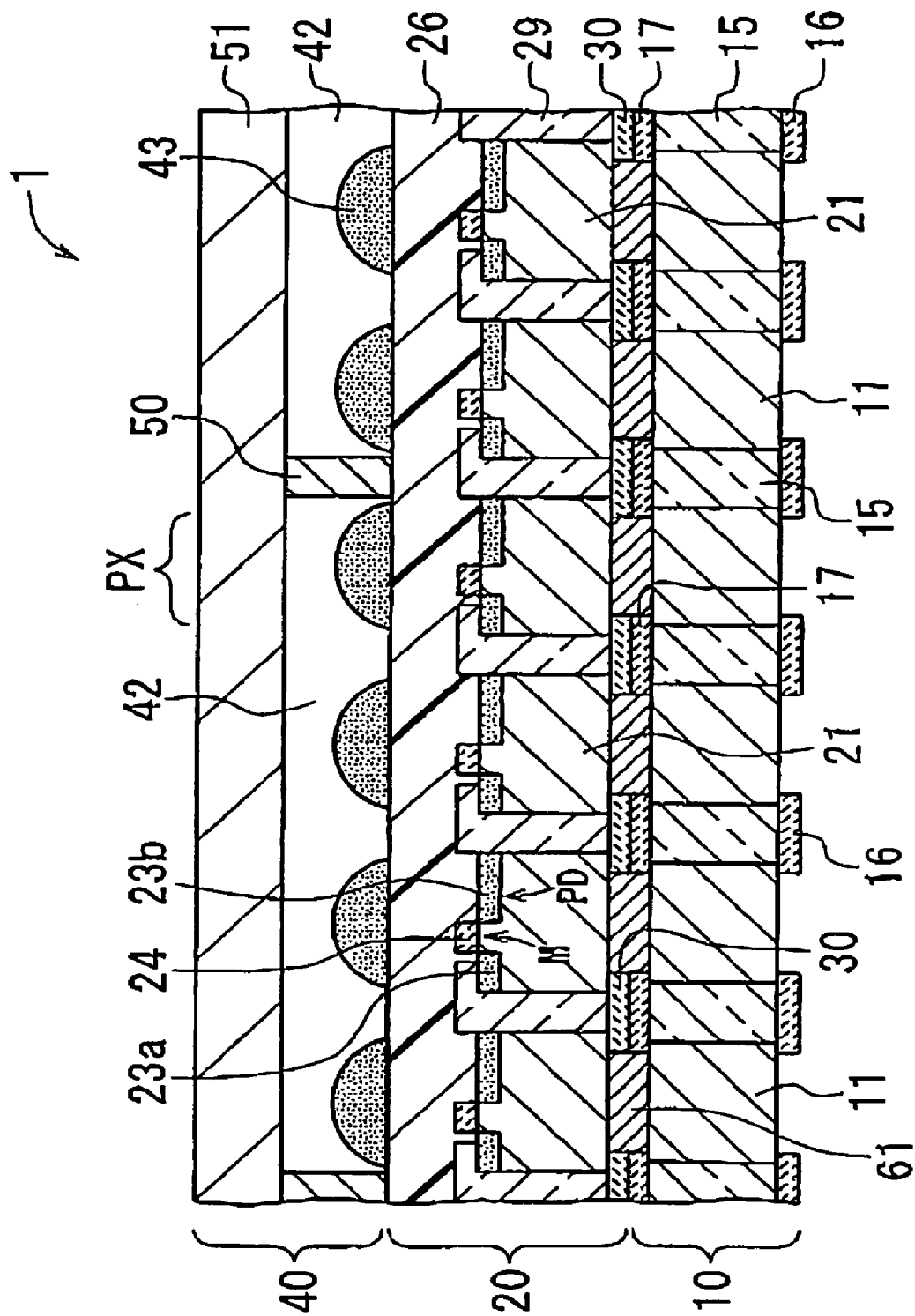
FIG. 2 is a cross-sectional view of a main part of the solid-stage image sensor according to the first embodiment of FIG. 1.

FIG. 2 is a partial, cross-sectional view showing the configuration of a main part of a solid-stage image sensor 1 according to a first embodiment of the invention, and FIG. 1 is a partial, enlarged cross-sectional view of the sensor 1.

As shown in FIGS. 1 and 2, the solid-state image sensor 1 has a three-layer structure comprising an output layer 10, a light-receiving element layer 20, and a light-introducing layer 40. The sensor 1 has pixel regions PX arranged in a matrix array. The sensor 1 picks up an image and converts it to electric signals in all the pixel regions PX and thereafter, outputs the electric signals. Each pixel region PX has a rectangular plan shape in this embodiment; however, needless to say, it may have any other plan shape, such as circular or hexagonal one.

The light-introducing layer 40 picks up light from an image located outside the image sensor 1 (i.e., an external image) and sends the light to the light-receiving element layer 20 in every pixel region PX. The light-receiving element layer 20 converts the light thus picked up by the light-introducing layer 40 to electric signals corresponding thereto in every pixel region PX. The output layer 10 outputs the electric signals obtained in the light-receiving element layer 20 to the outside of the sensor 1 in every pixel region PX. The electric signals thus outputted are sent, for example, to a display device and used to display the external image on its screen, or to an optional signal-processing circuit and used for predetermined signal processing.

Next, the structure of the light-introducing layer 40, the light-receiving element layer 20, and the output layer 10 will be respectively explained in detail below.

As clearly shown in FIG. 1, the light-receiving element layer 20 comprises a p-type single-crystal silicon (Si) substrate 21 whose lower surface is covered with an insulator film 27. On the upper surface of the Si substrate 21, an isolation film 22 is selectively formed, defining element-formation regions (i.e., active regions) in a one-to-one correspondence to the pixel regions PX. In other words, these element-formation regions are arranged in the same matrix array as the pixel regions PX.

In the following explanation, the region where the isolation film 22 is formed will be termed an "isolation region". Therefore, the isolation region and the element-formation regions are present on the upper surface of the substrate 21.

In each of the element-formation regions of the Si substrate 21, a MOS (Metal-Oxide-Semiconductor) field-effect transistor (which will be abbreviated "MOS transistor" hereinafter) M and a photodiode PD are formed. The MOS transistor M and the photodiode PD are electrically connected to each other. The photodiode PD is a semiconductor light-receiving element for converting incident light to an electric signal. The MOS transistor M is a semiconductor switching element for taking the electric signal generated by the photodiode PD out from the light-receiving element layer 20.

The MOS transistor M is formed by a pair of $n^+$-type source/drain regions (S/D regions) 23a and 23b formed in the substrate 21 to be apart from each other, an insulator film 25aa covering the upper surface of the substrate 21 between the S/D regions 23a and 23b, and a gate electrode 24 formed on the insulator film 25aa. The insulator film 25aa, which is a part of the insulator film 25a positioned right below the gate electrode 24, serves as a gate insulator film. The gate electrode 24 is located near one end (on the left-hand side in FIG. 1) of the element-formation region. On the side of the gate electrode 24 in the said element-formation region, a wiring film 31 is formed on the isolation film 22. The wiring film 31 contacts the source/drain region 23a (on the left-hand side in FIG. 1) by way of a window of the insulator film 25a. The remaining part of the surface of the element-formation region other than the window is covered with the insulator film 25a.

The photodiode PD is formed by the $n^+$-type source/drain region 23b (on the right-hand side in FIG. 1) and the p-type single-crystal Si substrate 21. Specifically, the photodiode PD commonly uses the source/drain region 23b of the MOS transistor M, which connects electrically the photodiode PD and the MOS transistor M. The source/drain region 23b serves as the light-receiving region of the photodiode PD.

The MOS transistors M and the photodiodes PD formed in the respective element-formation regions are covered with an interlayer insulator film 25b. The film 25b covers the whole surface of the Si substrate 21. On the interlayer insulator film 25b, an interlayer insulator film 26 having a larger thickness than the film 25b is formed to cover the whole surface of the substrate 21. The surface of the interlayer insulator film 26 is planarized to be parallel to the substrate 21 in order to facilitate the formation and fixture to the light-introducing layer 40.

The interlayer insulator films 25b and 26 and the insulator film 25a are formed by a material (e.g., $SiO_2$) that is transmissive to light detectable by the image sensor 1. External light introduced into the image sensor 1 by the light-introducing layer 40 is irradiated to the photodiodes PD in the respective element-formation regions of the light-receiving element layer 20 through the interlayer insulator films 25b and 26 and the insulator film 25a. Therefore, the parts of the films 25b, 26 and 25a corresponding to (in other words, superpose on) the respective photodiode-formation regions serve as the "light-transmissive regions". As explained later, the light-introducing layer 40 is formed on the "light-transmissive regions" and fixed thereto.

The whole surface of the light-receiving element layer 20 is optically transmissive in the first embodiment. However, this is not always necessary. The surface of the layer 20 may be partially optically transmissive. It is sufficient that the "light-transmissive regions" are present on the surface of the layer 20 corresponding to the photodiodes PD.

On the Si substrate 21, buried interconnections for connecting the upper surface of the substrate 21 and the lower surface thereof are formed at the location of the isolation film 22 (i.e., the isolation region). Each of the buried interconnections is formed by an insulator film 28 that covers the inner wall of a hole vertically penetrating the substrate 21, a conductive plug 29 filled in the inside of the film 28, and a microbump electrode 30 formed to contact the lower end of the plug 29. Since the upper end of the plug 29 contacts the wiring film 31 formed on the isolation film 22, and the film 31 contacts the $n^+$-type source/drain region 23a, the source/drain region 23a is electrically connected to the microbump electrode 30 by way of the wiring film 31 and the conductive plug 29.

A n-channel MOS transistor (nMOS) is used as the switching transistor in the first embodiment. However, a p-channel MOS transistor (pMOS) may be used and a complementary MOS (CMOS) transistor structure obtained by combining n- and p-channel MOS transistors may be used for this purpose. Any other transistor than MOS transistors or any other electronic element may be used for this purpose.

Next, the light-introducing layer 40 is explained.

The light-introducing layer 40 is formed on the interlayer insulator film 26 (in other words, on the light transmissive regions of the light-receiving element layer 20) and fixed thereto. The layer 40 has a plate-shaped quartz cap 51 supported by a supporting wall 50 on the planarized surface of the film 26. The lower and upper ends of the wall 50 are fixed to the upper face of the film 26 and the inner face of the cap 51, respectively.

A cavity 42 is formed by the supporting wall 50 between the interlayer insulator film 26 and the cap 51. In the cavity 42, microlenses 43 are arranged in a matrix array. These microlenses 43 are arranged in one-to-one correspondence to the pixel regions PX. In other words, the microlenses 43 are arranged right over the corresponding element-formation regions with the photodiodes PD in the light-receiving element layer 20 in such a way that the microlenses 43 are superposed on the corresponding element-formation regions.

Here, the plan shape of the cap 51 is rectangular in accordance with the plan shape of the image sensor 1. However, it may be of any other shape. Although the plan shape of the cavity 42 is the same as that of the cap 51, it may be of any other shape. The plan shape of the microlens 43 is circular here; however, it may be of any other shape. The height of the microlens 43 is, for example, 1 μm to 3 μm.

The supporting wall 50 extends not only along the whole periphery of the rectangular cap 51 in such a way as to define the outer edge of the cavity 42 but also along other locations than the periphery of the cap 51 (i.e., the inside of the cap 51). Since the wall 50 is provided to form the cavity 42, the wall 50 may be simply formed to be rectangular in such a way as to extend along the periphery of the rectangular cap 51 only. If so, however, there is a possibility that the mechanical strength of the light-introducing layer 40 is insufficient. Accordingly, in consideration of this point, the wall 50 is lattice-shaped in the other locations than the periphery of the cap 51 (i.e., the inside of the cap 51), thereby resolving the problem about the mechanical strength insufficiency.

As clearly shown in FIG. 1, the wall 50 is formed by an aluminum (Al) film 44, an adhesive 45, a single-crystal Si plate 41, and an adhesive 46, which means that the wall 50 has a four-layer structure. This is caused by the fabrication processes of the light-introducing layer 40, the detailed explanation of which will be presented later.

The Al film 44 is typically formed on the whole upper face of the interlayer insulator film 26 by an evaporation or sputtering method in such a way as to cover the microlenses 43 and to have a predetermined thickness. Thus, even if an adhesive is not used, the Al film 44 is fixed onto the upper surface of the film 26 and the surfaces of the microlenses 43. The Al film 44 on the microlenses 43 is selectively removed by etching; however, the Al film 44 between the microlenses 43 is not etched and left. The non-etched part of the Al film 44 constitutes a part of the supporting wall 50.

On the remaining Al film 44, the single-crystal Si plate 41 with a predetermined thickness is fixed with the adhesive 45. The Si plate 41 is selectively removed by etching in order to form the cavity 42. The non-etched part of the Si plate 41 constitutes another part of the wall 50.

On the Si plate 41, the quartz cap 51 is fixed with the adhesive 46. The cap 51 closes the whole upper opening of the cavity 42. As a result, the cavity 42 is defined by the interlayer insulator film 26, the supporting wall 50, and the quartz cap 51. The wall 50 has the four-layer structure comprising the Al film 44, the adhesive 45, the single-crystal Si plate 41, and the adhesive 46.

Quartz glass forming the quartz cap 51 has a light-transmissive property with respect to light detectable by the image sensor 1 and therefore, external light enters the inside of the cavity 42 through the cap 51. Subsequently, in every pixel region PX, the external light in the cavity 42 is collected by the microlenses 43 and then, is irradiated to the photodiodes PD in the respective element-formation regions through the interlayer insulator film 26 and 25b and the insulator film 25a.

Next, the output layer 10 is explained.

The output layer 10 is a layer for outputting the electric signals generated in the light-receiving element layer 20 corresponding to the irradiated external light to the outside of the image sensor 1. The output layer 10 comprises a single-crystal Si substrate 11 whose upper and lower surfaces are respectively covered with insulator films 13 and 12. Buried interconnections that connect the upper and lower surfaces of the substrate 11 (i.e., that penetrates through the substrate 11 vertically) are formed in the substrate 11. Each of the buried interconnections comprises an insulator film 14 that covers the inner wall of a hole vertically penetrating the substrate 11, a conductive plug 15 filled in the inside of the film 14, and microbump electrodes 17 and 16 formed to contact the upper and lower ends of the plug 15.

The Si substrate 11 of the output layer 10 and the Si substrate 21 of the light-receiving element layer 20 are fixed together by superposing the microbump electrodes 17 and 30, welding the electrodes 17 and 30, and filling an adhesive 61 in the gap between the substrates 11 and 21. The substrates 11 and 21 are parallel to each other. As the adhesive 61, a polyimide resin, epoxy resin, or the like may be preferably used.

In the solid-state image sensor 1 according to the first embodiment, no semiconductor element is present in the Si substrate 11 of the output layer 10, and the substrate 11 is simply used as a base for the buried interconnections. Therefore, the conductivity type of the substrate 11 is optional, in other words, the substrate 11 may be of the n- or p-type, or of the i-type where no dopant is contained. However, when semiconductor elements are formed in the substrate 11 similar to second and third embodiments to be explained later, the conductivity type of the substrate 11 needs to be selected in accordance with the semiconductor elements.

Operation of Solid-State Image Sensor

Next, the operation of the solid-state image sensor 1 according to the first embodiment having the above-described configuration is explained.

First, the image pickup surface of the image sensor 1, i.e., the surface of the quartz cap 51 of the light-introducing layer 40, is directed toward a desired object to be picked up, and the sensor 1 is placed near the object. Then, light emitted from the object (i.e., external light) is picked up into the inside (i.e., the cavity 42) of the image sensor 1 through the quartz cap 51. The light thus picked-up is collected by the microlenses in the cavity 42 and irradiated to the photodiodes PD of the light-receiving element layer 20. The collection and irradiation operations of light are carried out in every pixel region PX.

The photodiode PD in each pixel region PX photoelectrically converts the light thus received and generates an electric signal in accordance with the intensity of the light. The electric signal is sent to the output layer 10 by way of the switching MOS transistor M connected to the said photodiode PD. Specifically, the MOS transistor M is switched to become the ON (i.e., conduction) state when outputting the electric signal and therefore, the electric signal is sent to the lower surface of the Si substrate 21 (i.e., the outside of the light-receiving element layer 20) by way of the wiring film 31, the conductive plug 29, and the microbump electrode 30 of the layer 20. Furthermore, the signal is sent to the microbump electrode 16 located on the lowermost surface of the image sensor 1 by way of the microbump electrode 17 and the conductive plug 15 in this way, the signal can be derived from the electrode 16 of the output layer 10.

In the first embodiment, the microbump electrodes 16 of the output layer 10 serve as the output terminals of the solid-state image sensor 1.

As described above, the electric output signals of the image sensor 1 according to the first embodiment are outputted from the corresponding microbump electrodes (i.e., the output terminals) 16 arranged in a matrix array on the lowermost surface or bottom face of the image sensor 1. Therefore, this sensor 1 has an equivalent configuration to that of the so-called "area array package".

Figure 13:
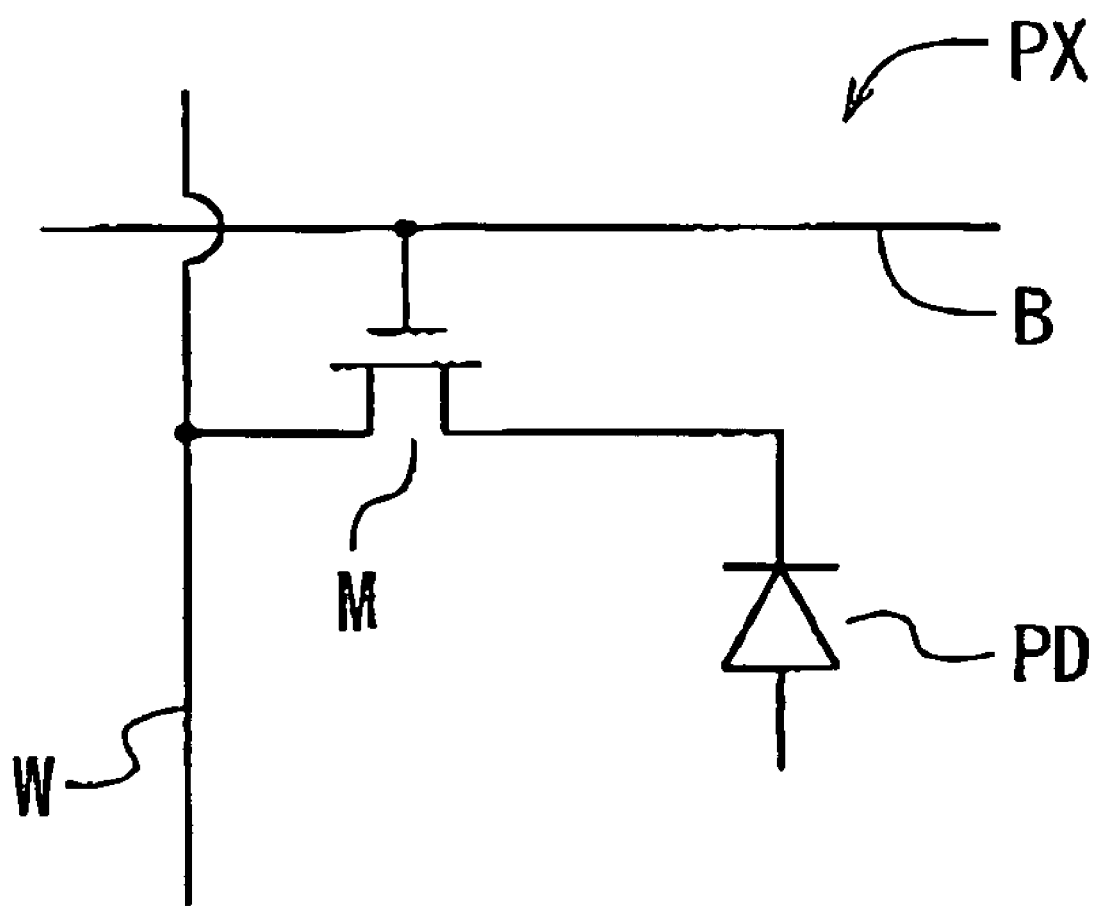
FIG. 13 is a circuit diagram showing the circuit configuration of each pixel region of the image sensor according to the first embodiment of FIG. 1.

FIG. 13 is a circuit diagram showing the circuit configuration in each pixel area PX. As understood from FIG. 13, the cathode of the photodiode PD is connected to one of the source/drain regions of the MOS transistor M. The gate electrode and the other of the source/drain regions are connected to a signal line B and a signal line W, respectively. This configuration is known and thus, further explanation is not presented here.

Method of Fabricating Solid-State Image Sensor

Subsequently, a method of fabricating the solid-state image sensor 1 according to the first embodiment of the invention having the above-described configuration is explained with reference to FIGS. 3 to 12.

Figure 3:
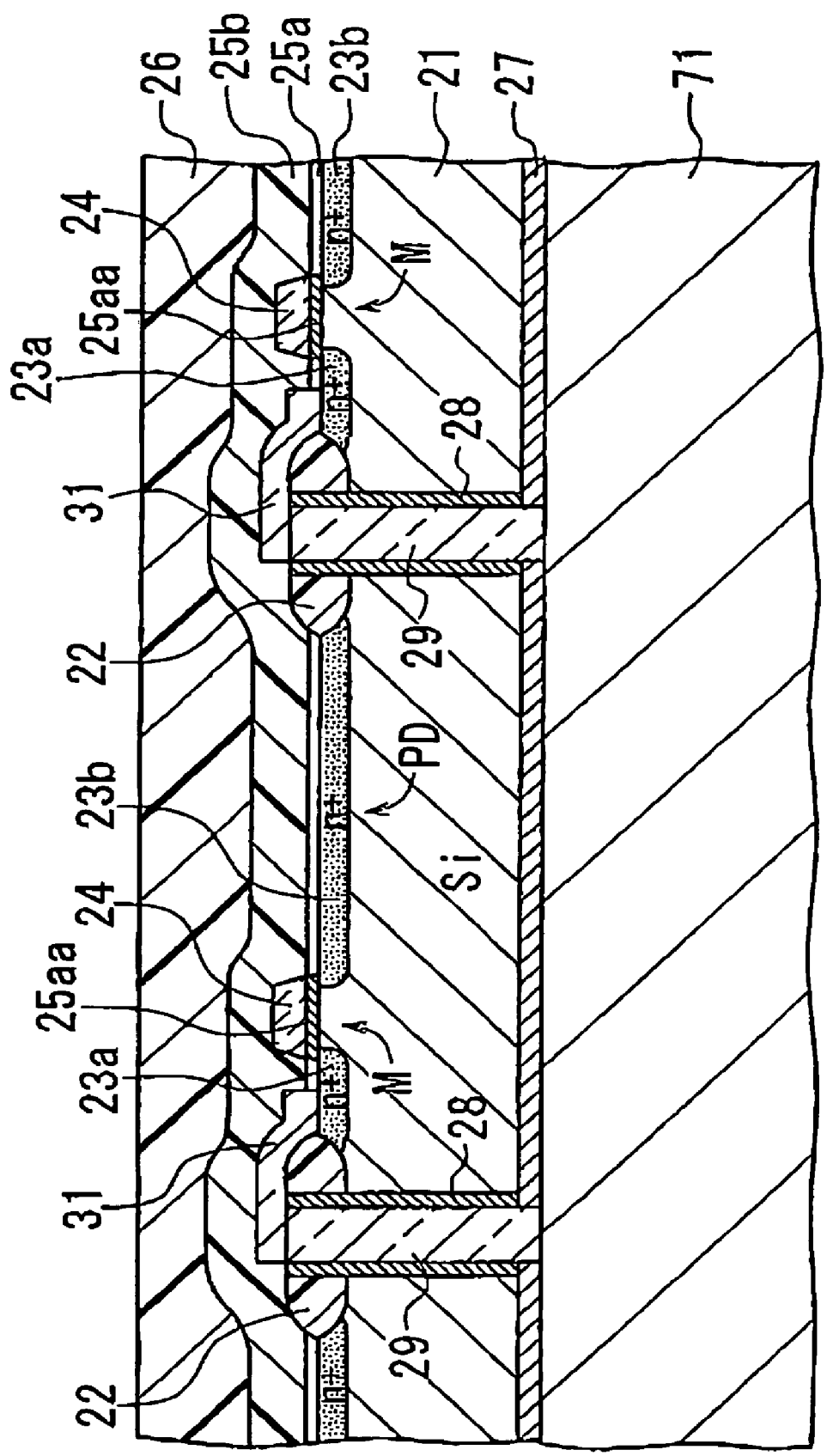
FIG. 3 is a view showing the process steps of a method of fabricating the solid-stage image sensor according to the first embodiment of FIG. 1.

First, as shown in FIG. 3, a SOI (Silicon On Insulator) substrate formed by coupling a single-crystal Si substrate 71 with the. Si substrate 21 along with the intervening insulator film (here, SiO$_2$ film) 27 is prepared. Next, the element-formation regions are formed corresponding to the desired pixel regions PX in the upper Si substrate 21 by a known method. The MOS transistors M and the photodiodes PD are formed in the respective element-formation regions. The buried interconnections connected to the transistors M are formed. Thus, the configuration shown in FIG. 3 is obtained.

The configuration of FIG. 3 may be obtained by any method. For example, it is formed in the following way.

First, the isolation film (e.g., SiO$_2$ film) 22 is selectively formed on the surface of the p-type Si substrate 21 that constitutes the SOI substrate by a known method, thereby defining the element-formation regions on the surface of the substrate 21 in a matrix array corresponding to the pixel regions PX. Next, by a known method, holes vertically penetrating the substrate 21 are formed in the isolation film 22. At this time, by a know method, the insulator film 27 is partially removed at the locations just below these holes, thereby exposing the bottoms of the holes to the side of the Si substrate 71. After the inner walls of the holes are covered with the insulator films 28, the conductive plugs 29 are filled in the corresponding holes. At this time, the upper ends of the plugs 29 are exposed from the upper ends of the corresponding holes while the lower ends of the plugs 29 contact the substrate 71. In this way, the buried interconnections with the configuration shown in FIG. 3 are formed in the region (i.e., the isolation region) where the isolation film 22 exists.

Subsequently, in each element-formation region, the insulator film 25a is formed on the surface of the Si substrate 21 by a known method. Then, the gate electrode (e.g., which is made of polysilicon) 24 is selectively formed on the insulator film 25a. The part of the film 25a located just below the gate electrode 24 serves as the gate insulator film 25aa. At this time, the whole surface of the substrate 21 is covered with the film 25a in the respective element-formation regions. Thereafter, the pair of n$^+$-type source/drain regions 23a and 23b is formed in the substrate 21 by a known method, thereby completing the MOS transistor M.

Next, a window communicating the source/drain region 23a closer to the buried interconnection is formed in the insulator film 25a by a known etching method and then, the conductive wiring film 31 is selectively formed on the insulator film 25a and the isolation film 22 At this time, the wiring film 31 contacts the source/drain region 23a by way of the window on one hand, and contacts the upper end of the plug 29 on the other hand. Thus, the source/drain region 23a and the plug 29 are electrically connected by the wiring film 31.

Subsequently, the gate electrode 24 and the wiring film 31 are covered with the interlayer insulator film 25b. The interlayer insulator film 26 is then formed on the film 25b. The surface of the film 26 is polished by a CMP (Chemical Mechanical Polishing) method or an etching method, thereby planarizing the same surface. Thus, the configuration of FIG. 3 is obtained.

Following this, in the configuration of FIG. 3, a film for the microlenses 43 is formed on the whole surface of the interlayer insulator film 26 thus planarized. As the material of the film, an organic material such as photoresist or organic polymer, or an inorganic material such as polysilicon, silicon dioxide (SiO$_2$), or silicon nitride (SiN$_x$), may be preferably used. This material is formed to a film with a desired thickness by a method such as coating, sputtering, CVD, or the like.

Figure 4:
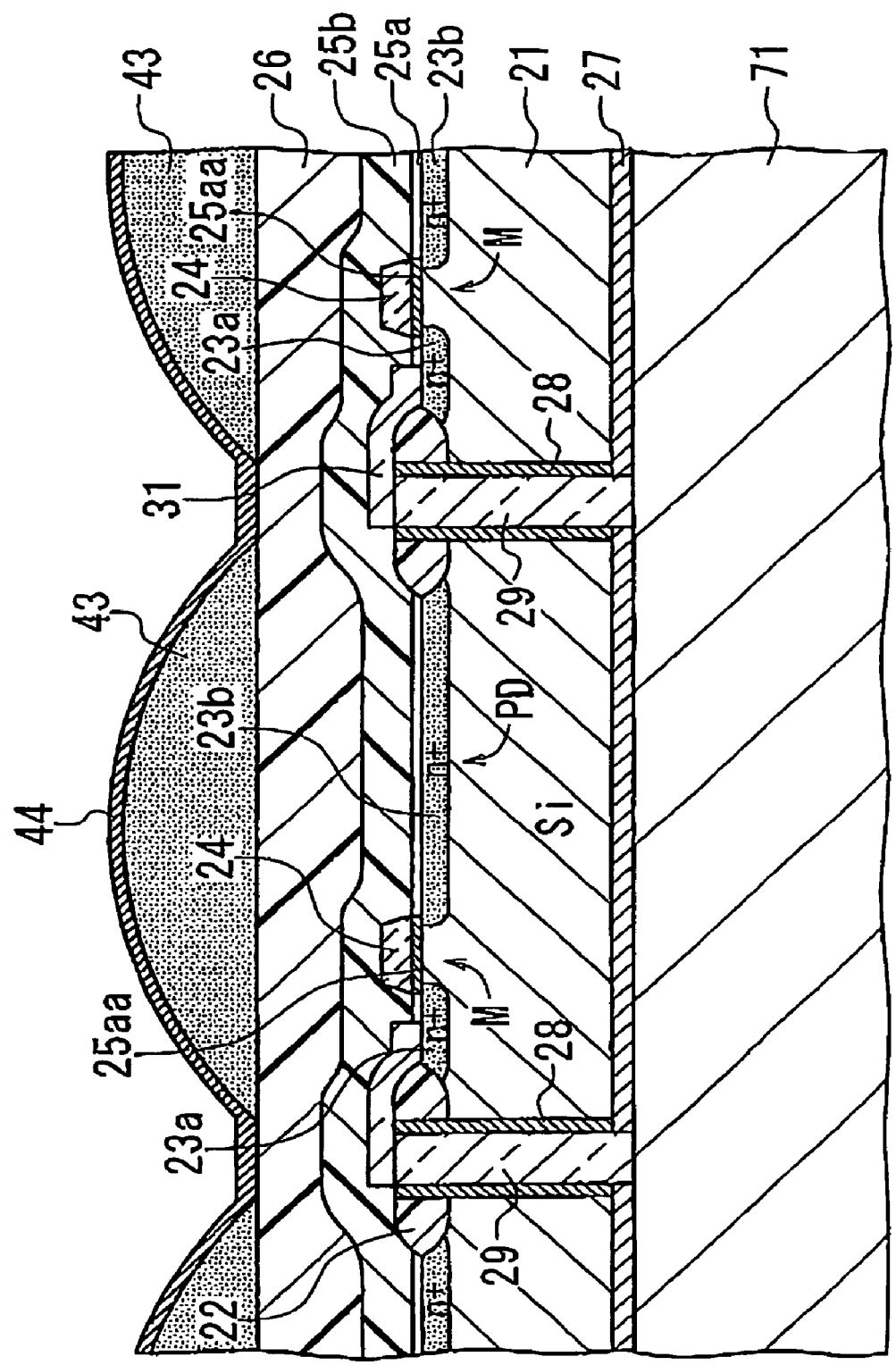
FIG. 4 is a view showing the process steps of the method of fabricating the image sensor according to the first embodiment of FIG. 1, which is subsequent to the step of FIG. 3.

When the microlenses 43 are formed by a film of a photoresist or organic polymer, the film is patterned by photolithography and etching methods to form approximately circular island-shaped parts and thereafter, it is subjected to heat treatment. Then, the surfaces of the island-shaped parts are curved to be convex, resulting in the microlenses 43 covering the respective element-formation regions, as shown in FIG. 4.

When the microlenses 43 are formed by a film of an inorganic material such as polysilicon, silicon oxide, or silicon nitride, a patterned photoresist film (i.e., a photoresist pattern) is formed on the inorganic material film, where the photoresist film has been patterned to have a desired shape of the microlenses 43. Using the photoresist film as a mask, the inorganic material film is selectively etched. Thus, the photoresist pattern is transferred to the inorganic material film, resulting in approximately circular island-shaped parts. These parts serve as the microlenses 43.

The microlenses 43, which may be formed by the above-described two methods, are arranged on the planarized surface of the interlayer insulator film 26 in a matrix array in one-to-one correspondence to the pixel regions PX.

Subsequently, the Al film 44 is formed on the whole planarized surface of the interlayer insulator film 26 by a method, such as evaporation, sputtering, or the like, in such a way as to cover all the microlenses 43 that have been formerly formed. The thickness of the Al film 44 is, for example, 100 nm to 400 nm. The state at this stage is shown in FIG. 4. As understood from FIG. 4, almost all the Al film 44 is located on the microlenses 43; however, part of the film 44 is contacted with and fixed to the surface of the film 26 through the gaps among the adjoining microlenses 43.

Figure 5:
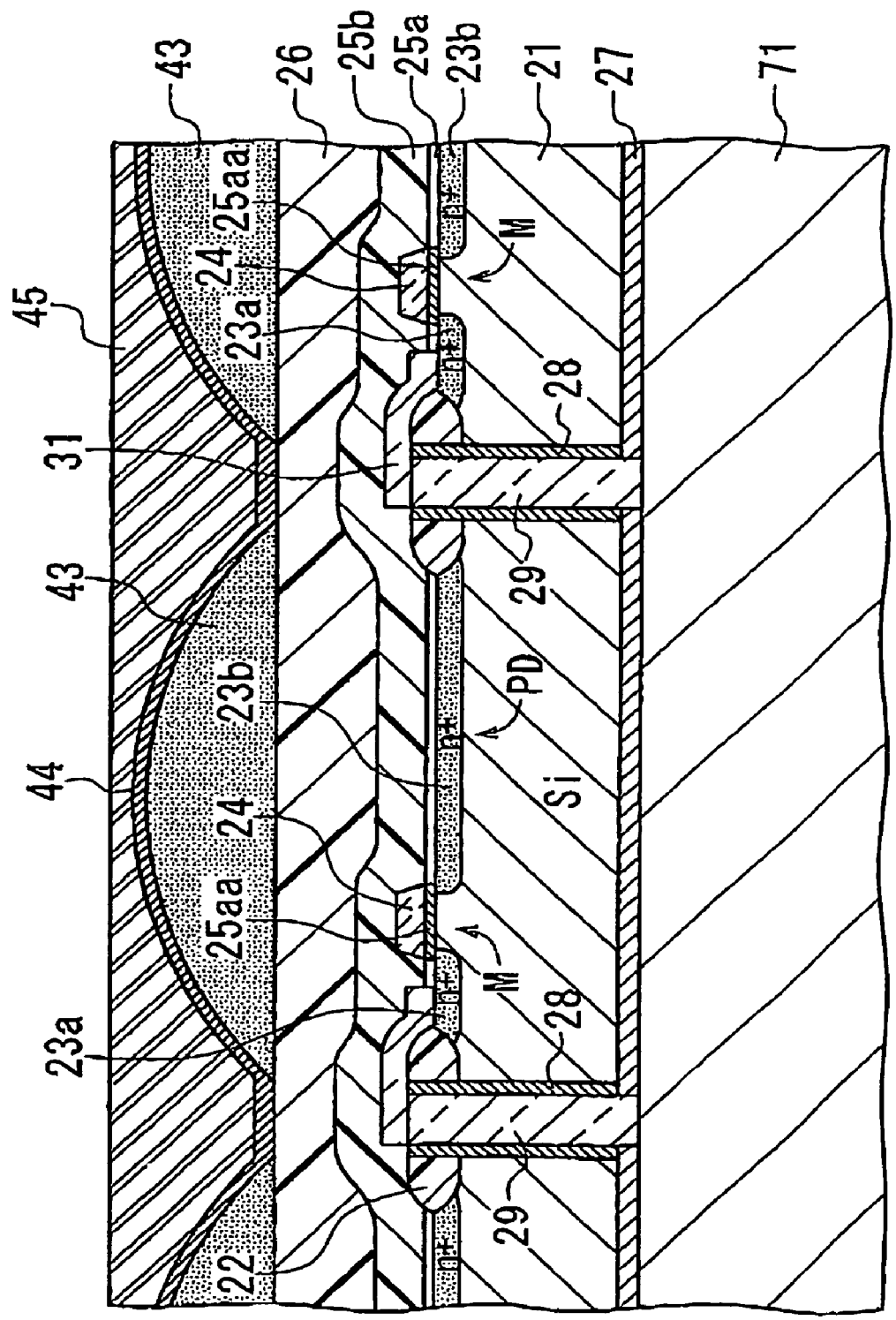
FIG. 5 is a view showing the process steps of the method of fabricating the image sensor according to the first embodiment of FIG. 1, which is subsequent to the step of FIG. 4.

Following this, as shown in FIG. 5, the adhesive 45 is coated on the Al film 44 to have a predetermined thickness. At this time, to facilitate the adhesion of the single-crystal Si plate 41, the surface of the adhesive 45 thus coated is planarized by a known method. Thus, the structure shown in FIG. 5 is obtained. Then, the plate 41 with a predetermined thickness (e g., approximately 100 μm-1000 μm) is adhered to the surface of the adhesive 45. The Si plate 41 is used as a part of the supporting wall 50 for forming the cavity 42. The state at this stage is shown in FIG. 6.

Figure 7:
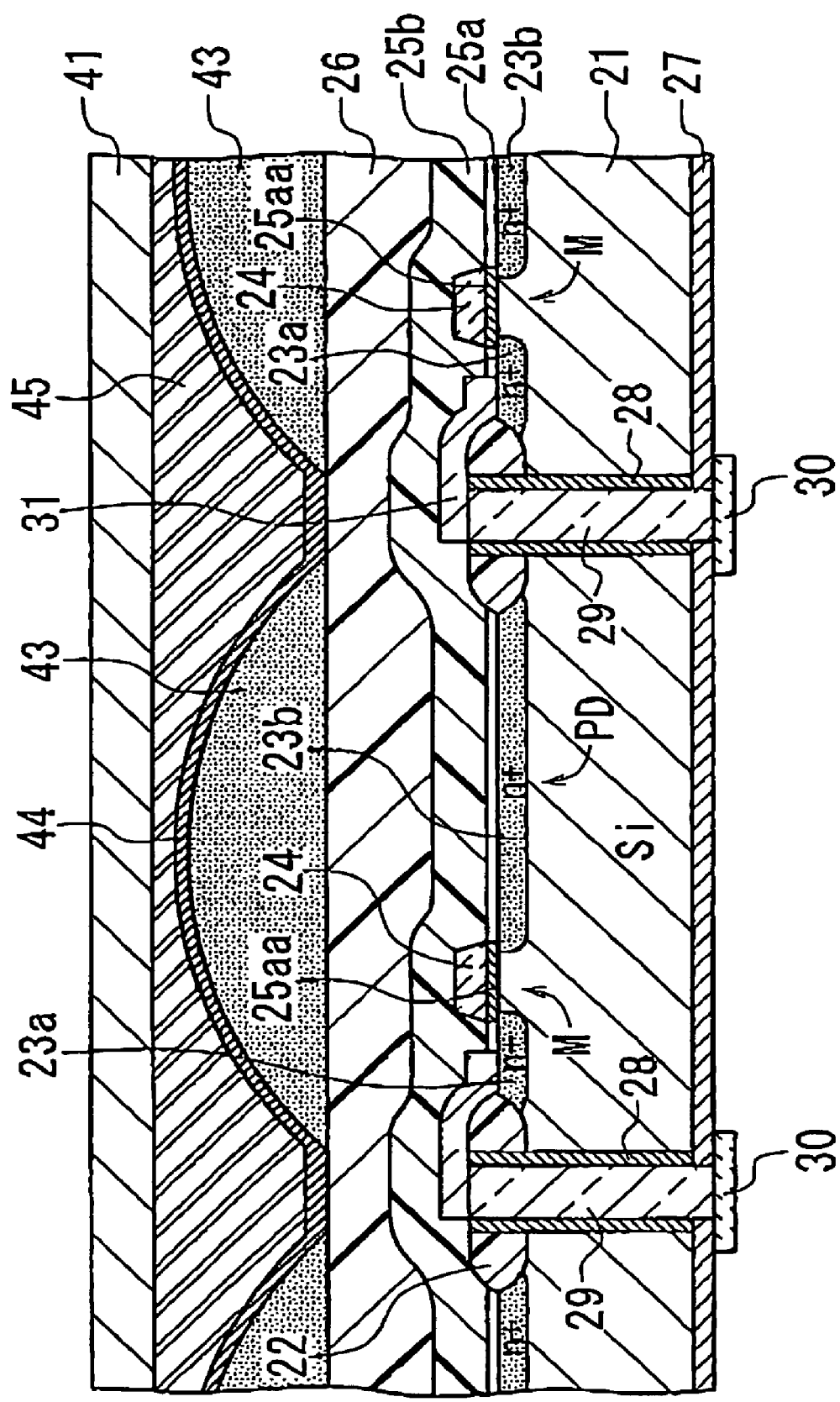
FIG. 7 is a view showing the process steps of the method of fabricating the image sensor according to the first embodiment of FIG. 1, which is subsequent to the step of FIG. 6.

The surface of the Si plate 41 adhered to the surface of the adhesive 45 is polished to thin the plate 41 until the plate 41 has a desired thickness. The thickness of the plate 41 after the polishing is, for example, approximately 50 μm-200 μm. The state at this stage is shown in FIG. 7.

In this embodiment, the single-crystal Si plate 41 is used to form the cavity 42: however, the invention is not limited to this. Needless to say, a plate made of any other material may be used as the plate 41 if it has a desired rigidity and a good processibility for etching or other processes.

Figure 6:
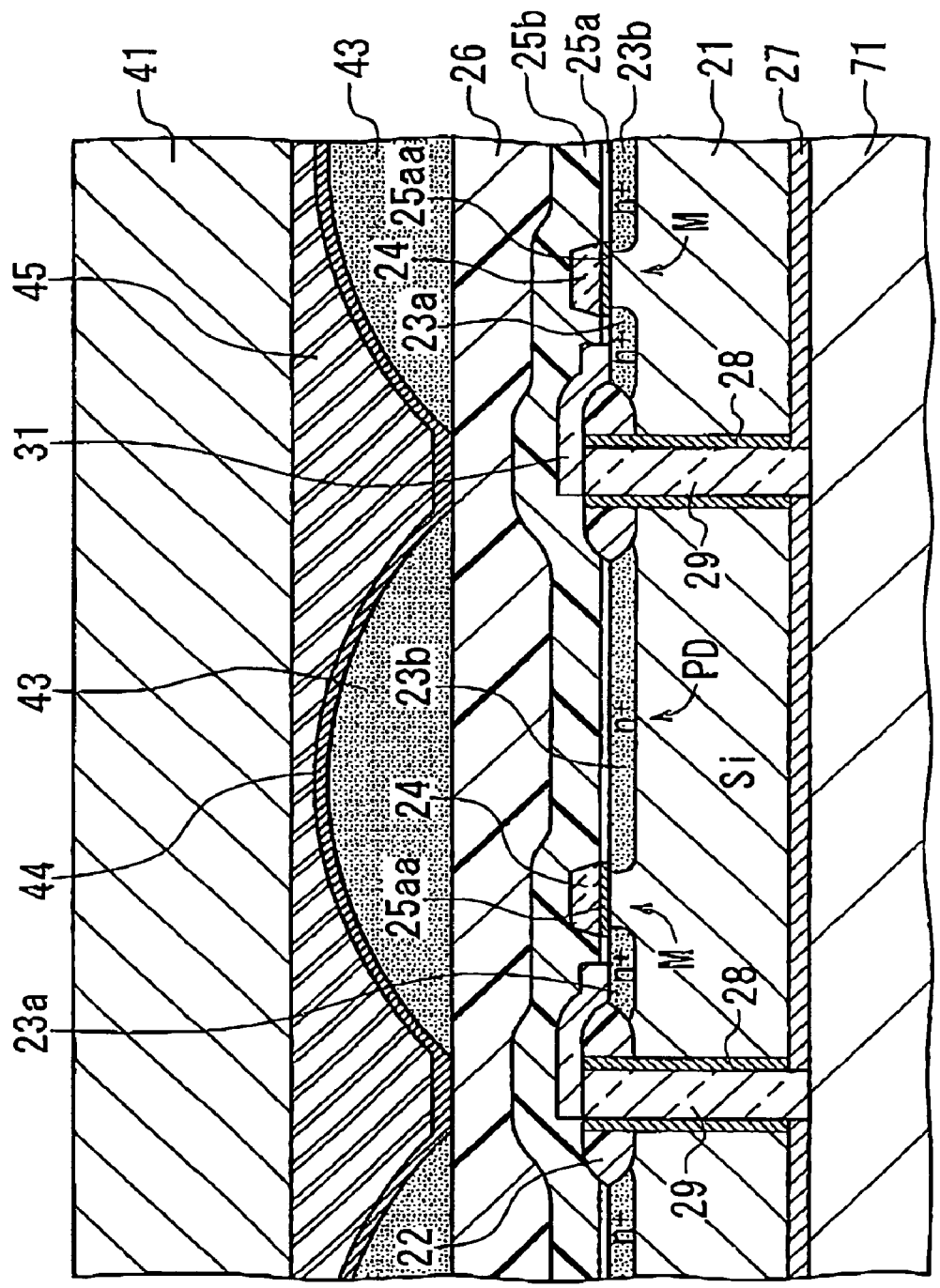
FIG. 6 is a view showing the process steps of the method of fabricating the image sensor according to the first embodiment of FIG. 1, which is subsequent to the step of FIG. 5.

Thereafter, the whole Si substrate 71 located at the lowermost level in the structure of FIG. 6 is removed by polishing or etching, thereby exposing the insulator film 27 between the Si substrates 71 and 21. By a known method, the microbump electrodes 30 are formed on and fixed to the lower ends of the conductive plugs 29 of the respective buried interconnections. The state at this stage is shown in FIG. 7.

As explained later, the Al film 44 is provided to protect the microlenses 43 located below the adhesive 45 when the Si plate 41 and the adhesive 45 are etched. In other words, the film 44 is used as an etch stop in this etching process. Therefore, a film made of any other material may be used for this purpose if it serves as an etch stop.

Figure 8:
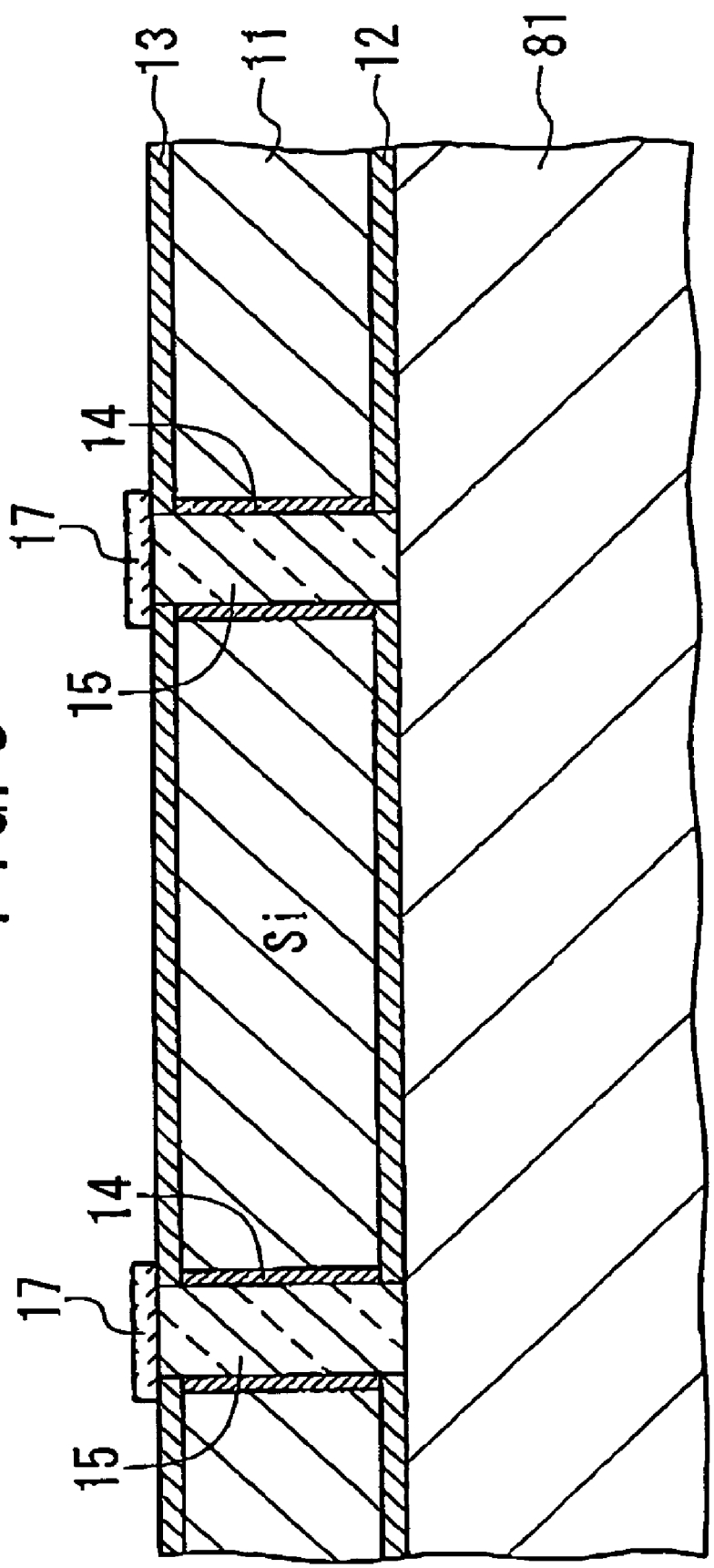
FIG. 8 is a view showing the process steps of the method of fabricating the image sensor according to the first embodiment of FIG. 1.

On the other hand, to fabricate the output layer 10, a SOI substrate that is formed by coupling a single-crystal Si substrate 81 and the single-crystal Si substrate 11 along with the intervening insulator film (here, the $SiO_2$ film) 12, as shown in FIG. 8. Then, holes vertically penetrating the substrate 11 are formed. At this time, the holes are formed in such a way that the insulator film 12 is partially removed at the locations just below the holes, thereby exposing the bottoms of the holes to the side of the Si substrate 81. After covering the inner sidewalls of the holes with the insulator films 14, the conductive plugs 15 are filled into the respective holes. At this time, the upper ends of the plugs 15 are exposed from the upper ends of the corresponding holes, and the lower ends of the plugs 15 contact the surface of the substrate 81. Moreover, the microbump electrodes 17 are formed on and fixed to the upper ends of the plugs 15 of the respective buried interconnections. In this way, the buried interconnections with the structure shown in FIG. 8 are obtained.

Figure 9:
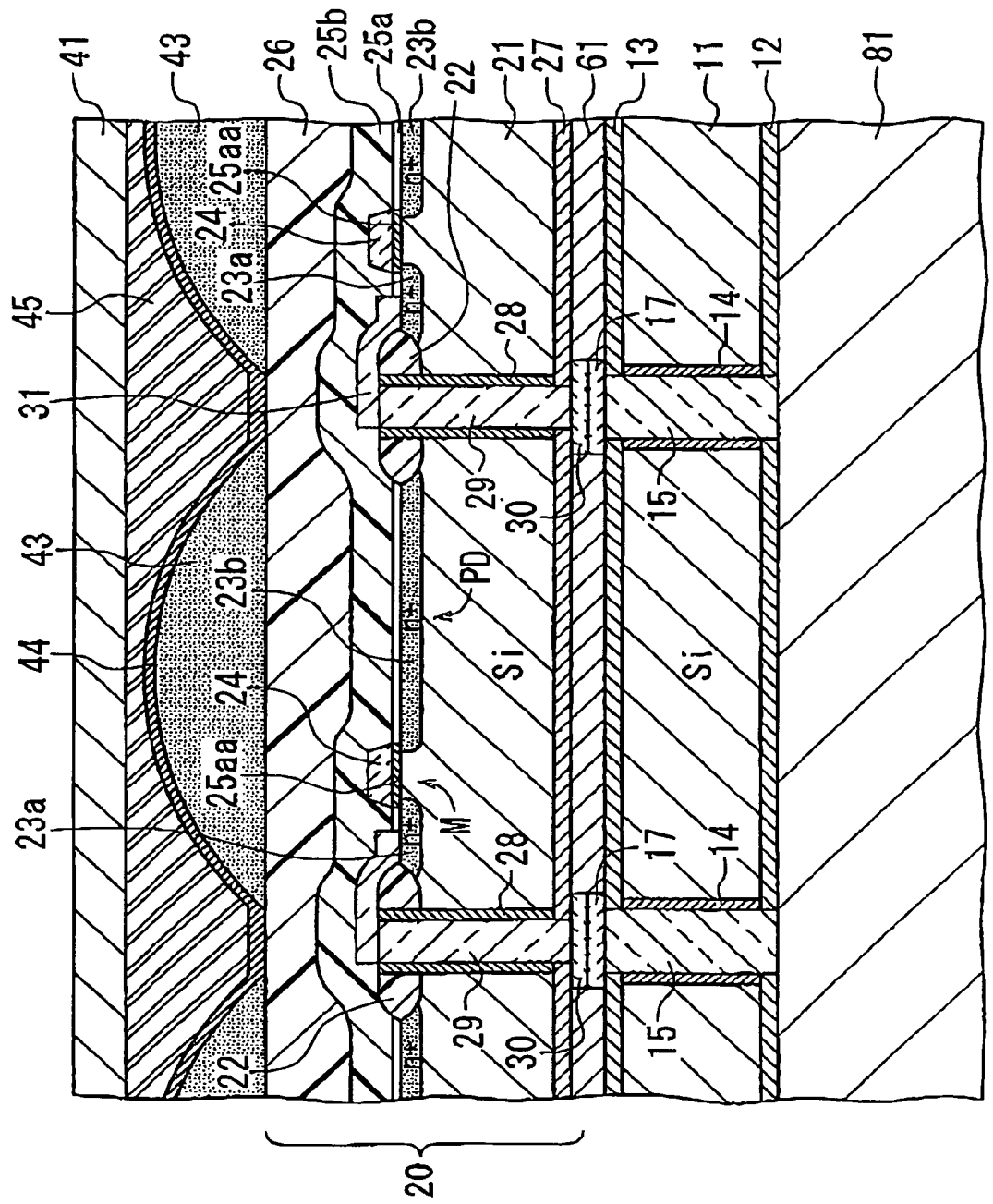
FIG. 9 is a view showing the process steps of the method of fabricating the image sensor according to the first embodiment of FIG. 1, which is subsequent to the steps of FIGS. 7 and 8.
Figure 10:
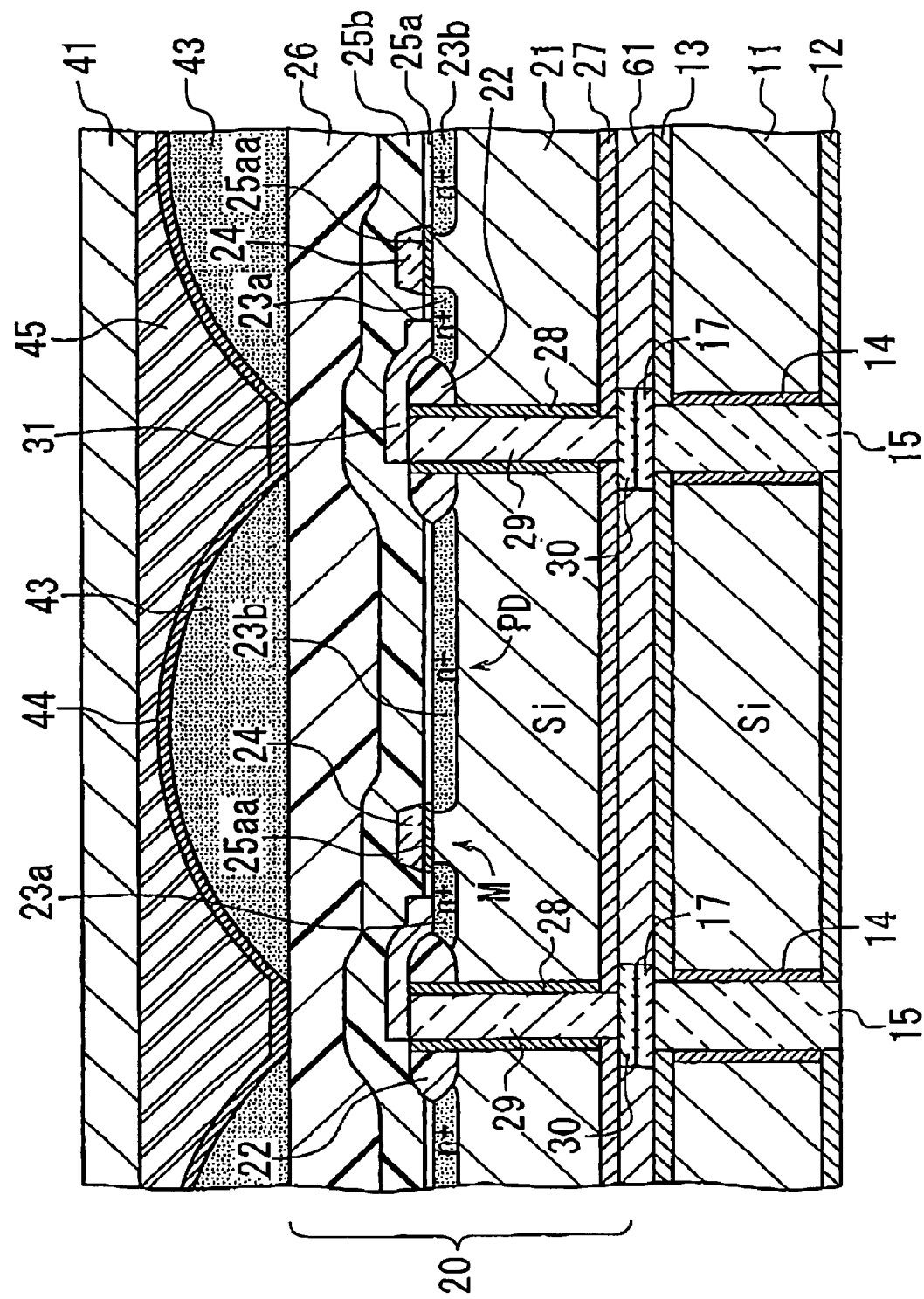
FIG. 10 is a view showing the process steps of the method of fabricating the image sensor according to the first embodiment of FIG. 1, which is subsequent to the step of FIG. 9.

Next, as shown in FIG. 9, while opposing the microbump electrodes 30 and 17 to each other, the structure of FIG. 7 is placed on the surface of the substrate 11 of FIG. 8 positioned on the side of the electrodes 17. Then, the adhesive 61 is filled into the gap between the two structures, thereby fixing them together. The electrodes 30 and 17 are welded to each other. In this state, the whole substrate 81 is removed by polishing or etching, thereby exposing the insulator film 12 and the plugs 15, as shown in FIG. 10.

Figure 11:
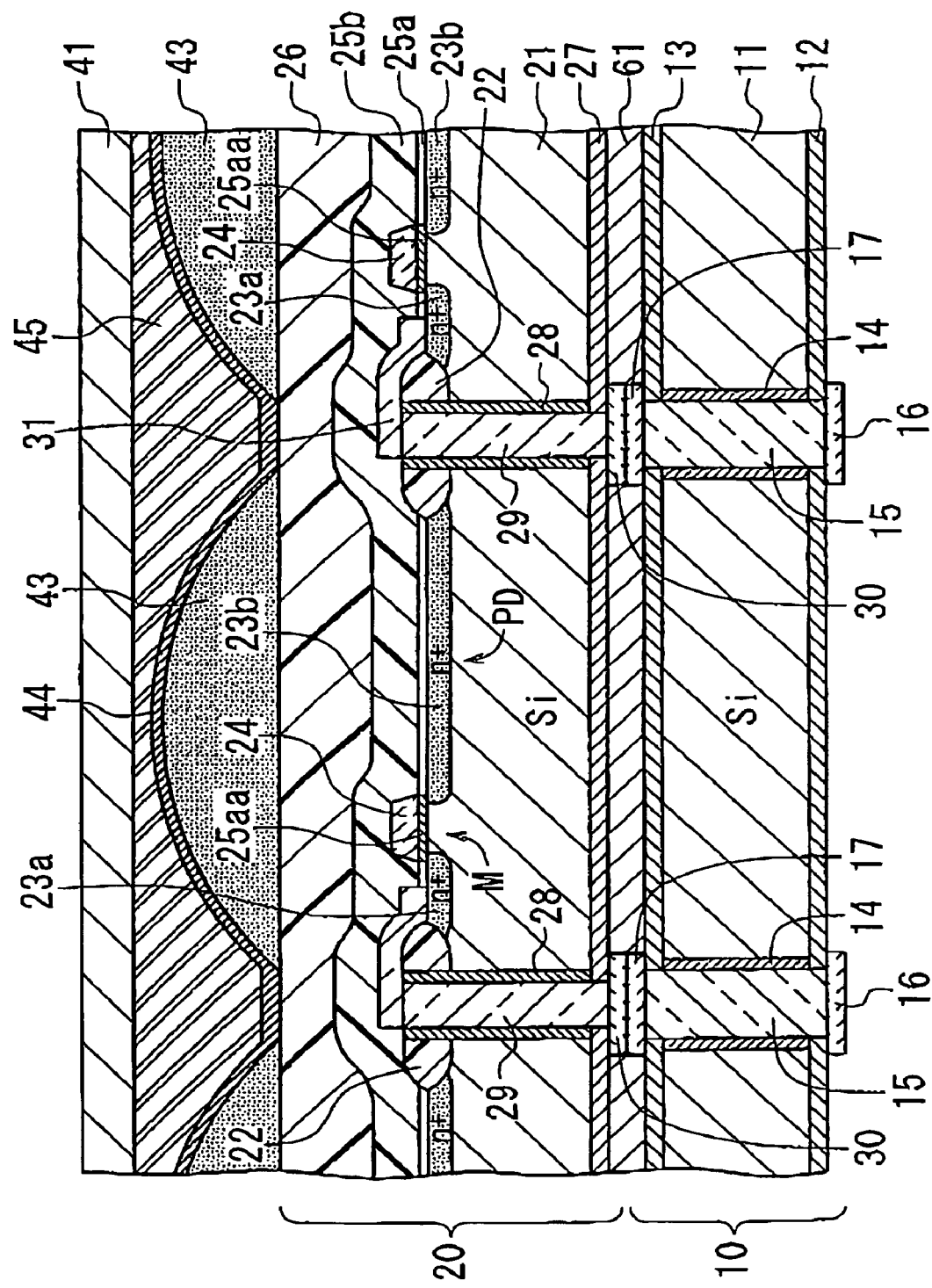
FIG. 11 is a view showing the process steps of the method of fabricating the image sensor according to the first embodiment of FIG. 1, which is subsequent to the step of FIG. 10.

The microbump electrodes 16 are formed on and fixed to the lower ends of the corresponding plugs 15, resulting in the structure of FIG. 11. The state at this time is that the light-receiving element layer 20 is adhered onto the output layer 10, and the microlenses 43 and other relating parts forming the light-introducing layer 40 are placed on the layer 20.

Using an appropriate mask, the uppermost Si plate 41 is selectively etched to form penetrating holes. Then using the same mask, the adhesive 45 located below the plate 41 is selectively etched. During these two etching processes, the Al film 44 serves as an etch stop and therefore, the microlenses 43 located below the film 44 are not affected by the etching action. Thus, protection of the microlenses 43 is ensured.

Figure 12:
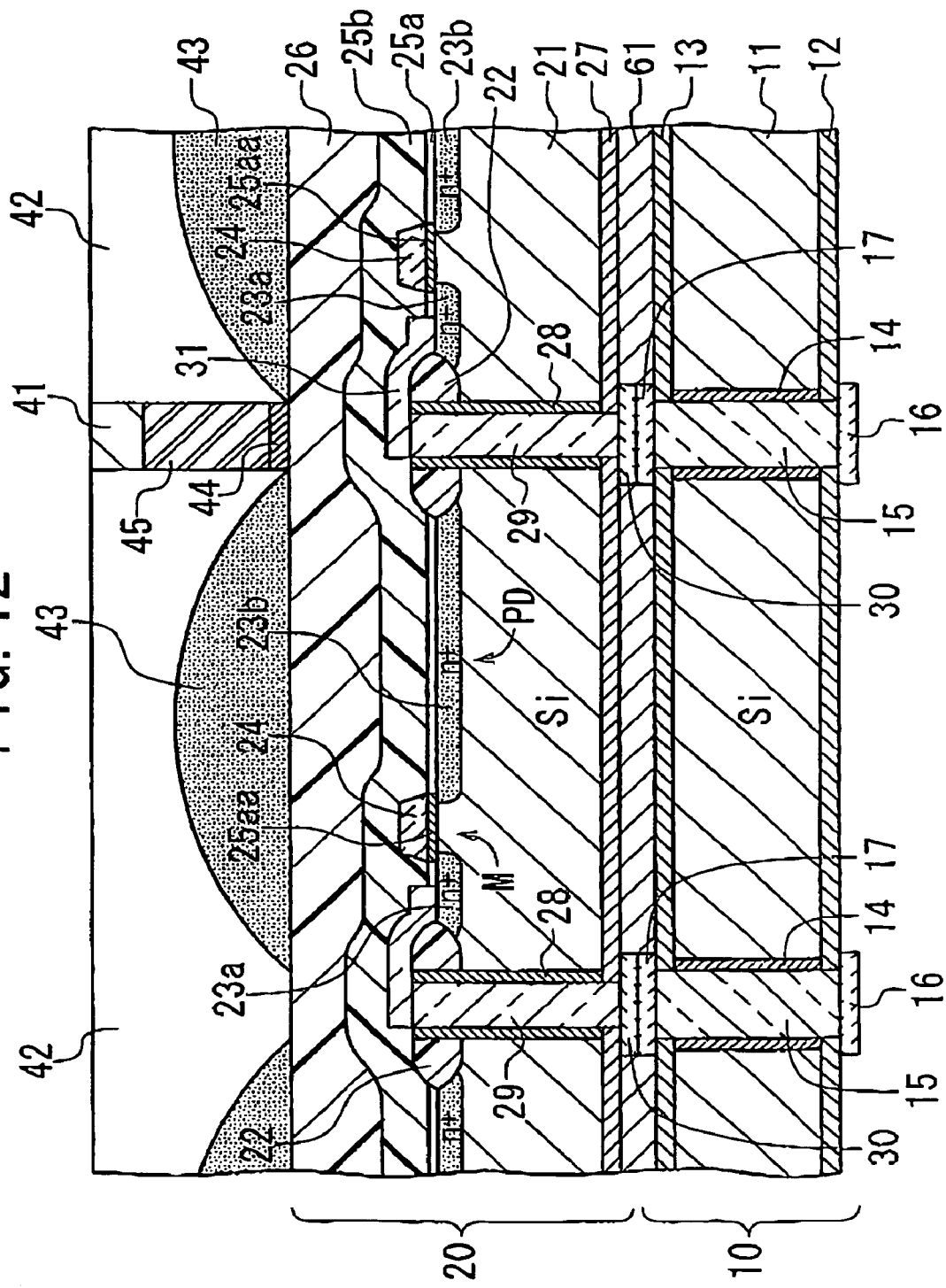
FIG. 12 is a view showing the process steps of the method of fabricating the image sensor according to the first embodiment of FIG. 1, which is subsequent to the step of FIG. 11.

Using the same mask, the Al film 44 exposed in the penetrating holes of the Si plate 41 is selectively removed by etching. Thus, the structure of FIG. 12 is obtained. In this state, the formation of the cavity 42 is almost completed and the microlenses 43 are exposed to the inside of the cavity 42.

Finally, onto the Si plate 41 used for forming the cavity 42, the rectangular cap 51 made of quartz glass is adhered with the adhesive 46, thereby closing the inner space. In this way, the supporting wall 50 and the cavity 42 of the light-introducing layer 40 are formed.

Through the above-described process steps, the solid-state image sensor 1 having the three-layer structure shown in FIGS. 1 and 2 is obtained.

Not to lower the optical transmittance of the cap 51 as much as possible, as shown in the figures, it is preferred that the adhesive 46 is located only the upper end of the wall 50. However, to simplify the coating process of the adhesive 46, the adhesive 46 may be coated on the entire inner face of the cap 51. In this case, the optical transmittance is slightly lowered due to existence of the adhesive 46: however, adjustment is possible at a level where no practical problem occurs.

In addition, it goes without saying that the method of fabricating the output layer 10 is not limited to the one described here. Any other method may be used for this purpose.

As explained above, the solid-state image sensor 1 according to the first embodiment of the invention comprises the light-receiving element layer 20, the light-introducing layer 40, and the output layer 10. The light-introducing layer 40 includes the microlenses 43, the supporting wall 50, and the light-transmissive quartz cap 51. The sensor 1 is configured in such a way that external light introduced into the cavity 42 by way of the cap 51 is irradiated to the semiconductor light-receiving elements, i.e., the photodiodes PD, of the light-receiving element layer 40 by way of the microlenses 43.

Thus, the image sensor 1 according to the first embodiment has the configuration that the light-introducing layer 20 for introducing external light and the output layer 10 for outputting the electric signals corresponding to the external light are coupled with the light-receiving element layer 20 including the photodiodes PD. Moreover, the light-introducing layer 40 for introducing external light includes the cavity 42 formed by the supporting wall 50 and the light-transmissive cap 51, and the microlenses 43 arranged in the cavity 42 and therefore, the light-introducing layer 40 carries out the function of a package including the microlenses 43. Accordingly, it can be said that the solid-state image sensor 1 according to the first embodiment has a configuration that such the light-introducing package is unified with the light-receiving element layer 20 and the output layer 10.

Furthermore, the microlenses 43, the wall 50, and the cavity 42 of the light-introducing layer 40 can be formed by known micro-fabrication techniques that have been used in semiconductor device fabrication and thus, the light-introducing package including the microlenses 43 can be miniaturized to a chip-size one. In other words, a chip-size light-introducing package can be made on the solid-state image sensor 1 according to the first embodiment.

Viewing from an aspect of the fabrication method, the image sensor 1 has a configuration that the package formed by the light-introducing layer 40 is unified with the light-receiving element layer 20 and the output layer 10. Thus, the process step of forming a package separately from a semiconductor chip and that of mounting the chip in the package are unnecessary and as a result, the fabrication process sequence is simplified. In addition, since the microlenses 43 are formed not on the surface of a quartz glass layer but on the interlayer insulator film 26 of the light-receiving element layer 20, extra sophisticated technologies used for forming the microlenses 43 on the surface of a quartz glass layer are not required.

To fabricate the light-receiving element layer 20 and the output layer 10, known stacking techniques for stacking a plurality of semiconductor chips to form a three-dimensional structure (i.e., techniques for stacking and joining substrates together with an adhesive while making their positional alignment) can be used. Thus, if the light-receiving element layer 20 and the output layer 10 are respectively formed with semiconductor substrates and thereafter, they are stacked and unified together, the light-receiving element layer 20 and the output layer 10 are easily fabricated.

Accordingly, the solid-state image sensor 1 does not require extra sophisticated technologies in its fabrication, which is easily fabricated.

Viewing from an aspect of the operation speed, the microlenses 43 of the light-introducing layer 40 are arranged closely to the light-transmissive regions of the light-receiving element layer 20 and therefore, external light passing through the microlenses 43 can be directly converted to the electric signals with the photodiodes PD. The electric signals can be directly outputted from the light-receiving element layer 20 to the outside by way of the output layer 10. As a result, the wiring line length for the electric signals obtained by converting the external light can be extremely shortened. Additionally, it is unnecessary to sequentially transfer the electric signals using CCDs. Accordingly, a sufficiently high operation speed (e.g., an operating frequency in the order of GHz) satisfying the recent demand of raising the signal-processing rate is obtainable.

Viewing from an aspect of the function, with the solid-state image sensor 1, various circuits such as amplifier circuits for electric input signals and a signal processing circuit can be easily incorporated into the light-receiving element layer 20 and/or the output layer 10. Alternately, it is easily realizable that a signal-processing circuit layer including a desired signal processing circuit is separately constituted and thereafter, the signal-processing circuit layer is inserted between the light-receiving element layer 20 and the output layer 10. As a result, various necessary circuits such as amplifier circuits for electric input signals and a signal processing circuit can be incorporated into the image sensor 1 according to the necessity.

As described above, with the first embodiment of the invention, the high-speed, high-sensitivity, high-performance, microminiaturized solid-state image sensor 1 is obtainable.

Additionally, the insulator film 27 formed on the lower surface of the Si substrate 21 of the light-receiving element layer 20 is not always necessary. This is because if the adhesive 61 is insulative, electrical insulation between the layer 20 and the output layer 10 is ensured. This is applicable to the insulator film 13 of the output layer 10.

When the electric signals obtained by photoelectric conversion of external light are outputted after desired signal processing is applied to them, a signal-processing circuit layer including a desired signal processing circuit may be additionally formed between the light-receiving element layer 20 and the output layer 10. Since the signal processing circuit layer is easily realizable with a similar configuration to the layer 20, detailed explanation about the signal processing circuit layer is omitted here.

In the above-described first embodiment, the output layer 10 is provided. However, needless to say, an interposer may be provided instead of the output layer 10.

Second Embodiment

Figure 14:
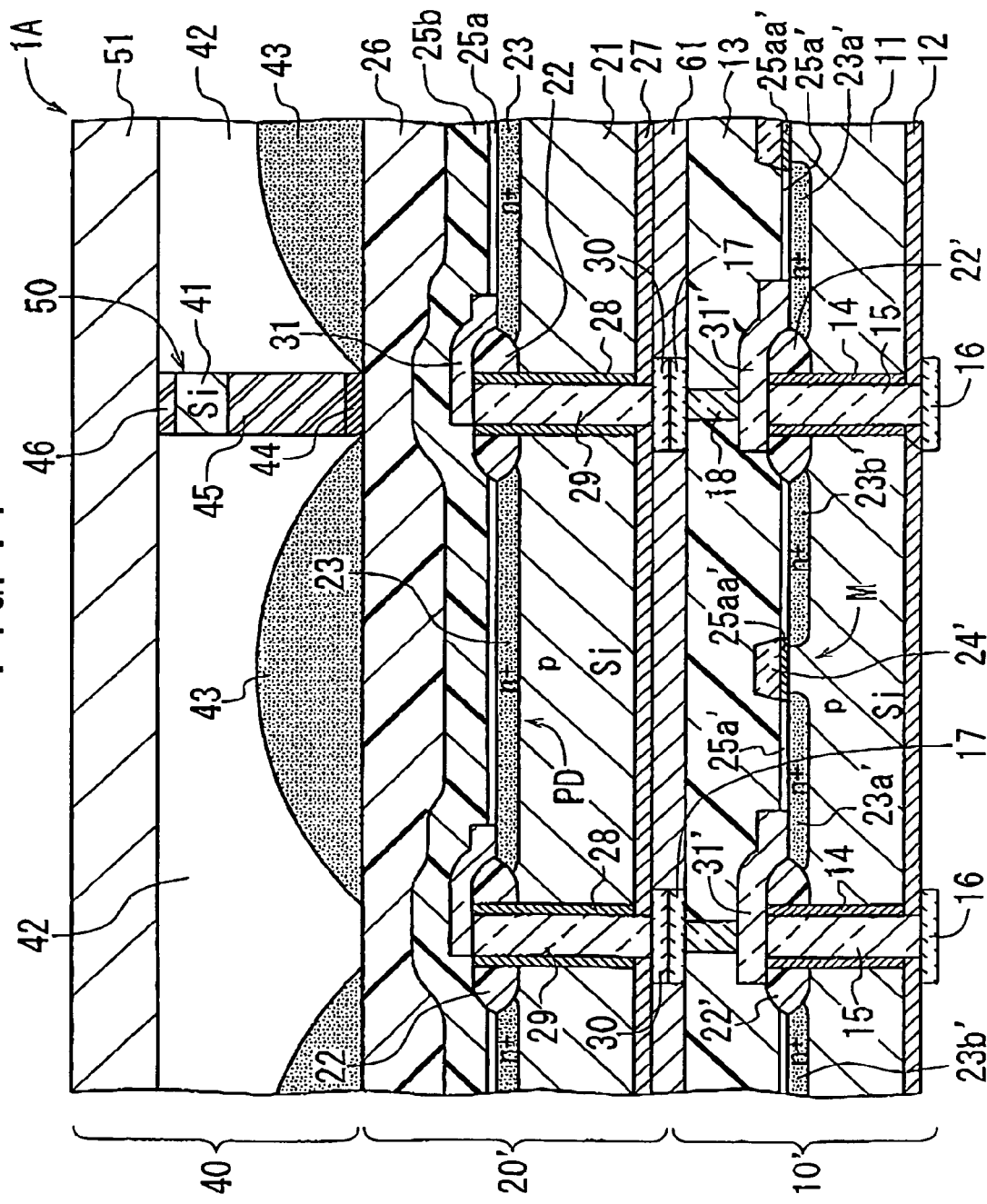
FIG. 14 is an enlarged cross-sectional view showing a main part of a solid-stage image sensor according to a second embodiment of the invention.

FIG. 14 shows the configuration of a solid-state image sensor 1A according to a second embodiment of the invention.

The image sensor 1A corresponds to one obtained by shifting the switching MOS transistors M to the output layer 10 from the light-receiving element layer 20 in the image sensor 1 according to the first embodiment. The other configuration of the sensor 1A is the same as the sensor 1. Therefore, explanation about the same configuration is omitted by attaching the same reference symbols as those used in the sensor 1 of the first embodiment to corresponding elements in FIG. 14.

As shown in FIG. 14, the image sensor 1A has a three-layer structure like the image sensor 1 of the first embodiment.

In the light-receiving element layer 20', a $n^+$-type diffusion region 23 is formed in each of the element-formation regions formed in the p-type single-crystal Si substrate 21. That is, only a photodiode PD is formed in each element-formation region. The sensor 1A is different from the sensor 1 according to the first embodiment at this point. Thus, almost all of each element-formation region can receive light; in other words, almost all of each element-formation region is a "light-receivable region". Therefore, the so-called "fill factor", which is defined as a percentage of the light-receiving area occupying the pixel area, can be set close to 100%. The other structure is the same as the sensor 1 of the first embodiment.

With the image sensor 1 according to the first embodiment, the MOS transistor M is present in each element-formation region and thus, the "light-receivable region" is decreased by that. This means that the "fill factor" is smaller compared with the sensor 1A according to the second embodiment.

In the output layer 10', the MOS transistors M, which are formed in the light-receiving element layer 20 of the sensor 1 according to the first embodiment, are formed in the single-crystal Si substrate 11. Specifically, as shown in FIG. 14, the output layer 10' has the p-type single-crystal Si substrate 11 whose lower surface is covered with the insulator film 12. The isolation film 22' is selectively formed on the upper surface of the substrate 11, defining the element-formation regions (i.e., active regions) in one-to-one correspondence to the pixel regions PX. This means that the element-formation regions are arranged in the same matrix array as the regions PX.

In each element-formation region of the Si substrate 11, at least one MOS transistor M is formed. This transistor M is constituted by a pair of $n^+$-type source/drain regions (S/D regions) 23a' and 23b' apart from each other in the substrate 11, an insulator film 25a' covering the upper surface of the substrate 11, and a gate electrode 24' formed on the layer 25a'. The part 25aa' of the insulator film 25a' positioned right below the gate electrode 24' serves as a gate insulator film. A wiring film 31', which is formed on the isolation film 22', contacts the source/drain region 23a' (on the left-hand side in FIG. 14) by way of a window of the insulator film 25a'. The remaining part of the surface of the element-formation region other than the window is covered with the insulator film 25a'.

The MOS transistors M formed in the respective element-formation regions are covered with an insulator film 13. The film 13 covers the whole surface of the substrate 11. The surface of the insulator film 13 is planarized to be parallel to the substrate 11 in order to facilitate the formation and fixture to the light-receiving element layer 20'.

In the insulator film 13, a conductive plug 18 is formed at the location just above the isolation film 22' for each element-formation region. The upper and lower ends of each plug 18 contact the corresponding microbump electrode 17 and the corresponding wiring film 31', respectively.

Each of the wiring films 31' formed on the isolation film 22' contacts the upper end of the corresponding conductive plug 15 on one hand, and contacts the $n^+$-type source/drain region 23a' on the other hand. Thus, the source/drain region 23a' is electrically connected to the corresponding microbump electrode 16 by way of the wiring film 31' and the plug 15. Since the wiring film 31' contacts the lower end of the corresponding conductive plug 18 formed in the insulator film 13, the film 31' is electrically connected to the diffusion region 23 as well. In this way, each of the photodiodes PD of the light-receiving element layer 20' is electrically connected to a corresponding one of the MOS transistors M of the output layer 10'.

Although only one MOS transistor M is illustrated in the output layer 10' in FIG. 14, a plurality of MOS transistors M may be mounted to constitute an amplifier circuit, a signal processing circuit, a memory circuit, or the like. A plurality of output layers may be provided to incorporate desired circuits in the respective output layers.

The solid-state image sensor 1A according to the second embodiment of the invention can be fabricated in approximately the same way as the first embodiment. Specifically, it is apparent that the light-receiving element layer 20' can be fabricated in approximately the same way as the light-receiving element layer 20 of the first embodiment. The output layer 10' can be fabricated by forming the MOS transistors M in the Si substrate 11 in the same way as used for the light-receiving layer 20 of the first embodiment and by conducting the other processes in the same way as used for the output layer 10 of the first embodiment. Therefore, detailed explanation about them is omitted.

The image sensor 1A according to the second embodiment of the invention has the above-described configuration and thus, it goes without saying that the same advantages as the sensor 1 of the first embodiment are obtainable. However, the following advantage is additionally obtainable in the sensor 1A.

With a solid-state image sensor using CCDs, generally, the so-called "fill factor" may be set high; however, there is a disadvantage that the operation speed cannot be so high and a processing such as amplification of an electric input signal is incapable (i.e., a separate, dedicated circuit for the processing is necessary). On the other hand, with a solid-state image sensor using photodiodes or MOS transistors as the light-receiving elements like the invention, good performance such as high-speed operation and high sensitivity is obtainable and such a processing as amplification of an electric input signal is possible. However, there is a disadvantage that the fill factor is difficult to be raised.

With the image sensor according to the second embodiment of the invention, the features (i.e., advantages) of these two types are obtainable. Specifically, high speed and high sensitivity are capable and at the same time, high resolution is realizable by raising the fill factor. Furthermore, high-level functions are easily possible because such a processing as amplification of an electric input signal or calculation can be carried out.

An interposer may be provided instead of the output layer 10' in the above-described second embodiment as well.

Third Embodiment

Figure 15:
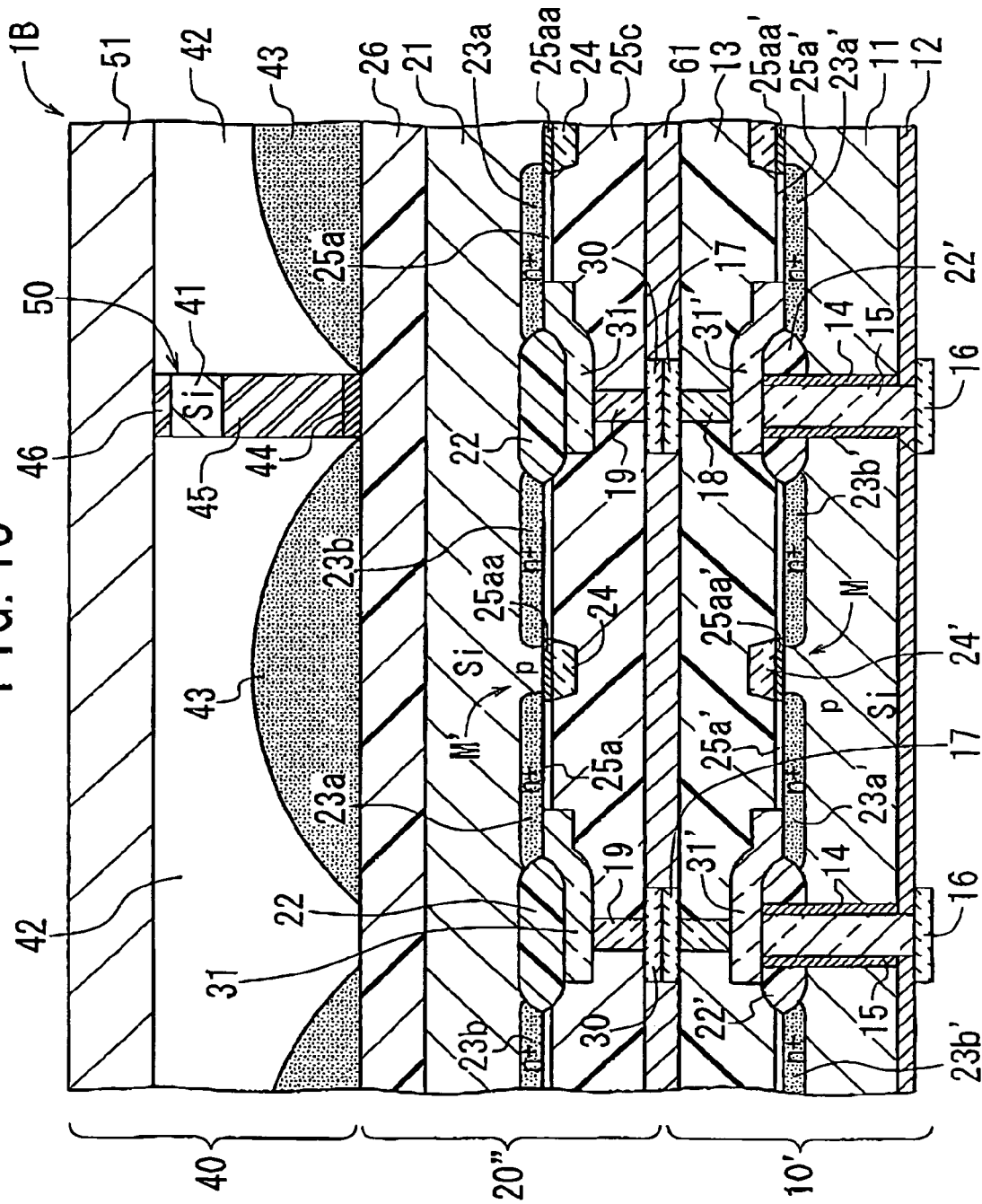
FIG. 15 is an enlarged cross-sectional view showing a main part of a solid-stage image sensor according to a third embodiment of the invention.

FIG. 15 shows the configuration of a solid-state image sensor 1B according to a third embodiment of the invention.

The sensor 1B corresponds to one obtained by providing light-receiving MOS transistors (i.e., phototransistors) M' in the light-receiving element layer 20" instead of the photodiodes PD in the solid-state image sensor 1A according to the second embodiment of FIG. 14. The other configuration of the sensor 1B is the same as the sensor 1A. The structure of the transistors M' of the layer 20" is substantially the same as that of the transistors M of the output layer 10'.

As shown in FIG. 15, the image sensor 1B has a three-layer structure as well. In the light-receiving element layer 20", a pair of source/drain regions 23a and 23b is formed in each of the element-formation regions formed on the lower side of the single-crystal Si substrate 21. The sensor 1B is different from the sensors 1 and 1A according to the second and third embodiments at this point.

With the image sensor 1B, the transistor M' as the light-receiving element is turned upside down in each element-formation region and therefore, light is receivable in almost all the element-formation region. In other words, approximately the whole element-formation region is the "light-receivable region". As a result, similar to the second embodiment, there is an advantage that the "fill factor" can be set near 100%. Further, external light introduced into the light-introducing layer 40 is irradiated to the MOS transistors M' by way of the Si substrate 21 of the light-receiving element layer 20".

The MOS transistor M' of the light-receiving element layer 20" is constituted by a pair of n⁺-type source/drain regions 23a and 23b formed apart from each other in the lower surface of the substrate 21, an insulator film 25a covering the lower surface of the substrate 11, and a gate electrode 24 formed below the film 25a. The part 25aa of the film 25a positioned right below the gate electrode 24 serves as a gate insulator film. A wiring film 31 is formed below the isolation film 22. The wiring film 31 contacts the source/drain region 23a (on the left-hand side in FIG. 15) by way of a window of the insulator film 25a. The remaining part of the surface of the element-formation region other than the window is covered with the insulator film 25a.

The lower surfaces of the transistors M' formed in the respective element-formation regions of the substrate 21 are covered with an insulator film 25c. The film 25c covers the whole surface of the substrate 21. The surface of the film 25c is planarized to be parallel to the substrate 21 in order to facilitate the formation and fixture to the output layer 10'.

In the insulator film 25c, conductive plugs 19 are buried at the locations just below the isolation film 22 for the respective element-formation regions. The upper and lower ends of each plug 19 contact the corresponding microbump electrodes 31 and 30, respectively.

In the output layer 10', each wiring film 31' formed on the isolation film 22' contacts the lower end of the corresponding conductive plug 18 on one hand, and contacts the n⁺-type source/drain region 23a' on the other hand. Thus, the source/drain region 23a' is electrically connected to the corresponding microbump electrode 17 by way of the wiring film 31' and the plug 18. The electrode 17 contacts the corresponding electrode 30 and thus, it is electrically connected to the electrode 30. Therefore, the region 23a is electrically connected to the source/drain region 23a' of the output layer 10' by way of the wiring film 31, the plug 19, the electrodes 30 and 17, the plug 18, and the wiring layer 31'.

In this way, the light-receiving MOS transistors M' of the light-receiving element layer 20" are electrically connected to the corresponding switching MOS transistors M of the output layer 10'.

Further, needless to say, photodiodes may be used instead of the light-receiving MOS transistors M'.

The solid-state image sensor 1B according to the third embodiment can be easily fabricated by combining the fabrication methods of the first and second embodiments. An example of the method of the sensor 1B will be simply explained below.

First, the light-receiving element layer 20" and the output layer 10' are respectively fabricated using separate single-crystal Si substrates. Specifically, the light-receiving element layer 20" uses a SOI substrate shown in FIG. 3 as the Si substrate 21. (An ordinary Si substrate may be used.) On the surface of the substrate 21, by a known method, the light-receiving transistors M' and the wiring films 31 shown in FIG. 15 are formed. Then, the insulator film 25c is formed on the surface of the substrate 21 to cover the light-receiving transistors M'. Thereafter, the conductive plugs 19 are buried in the film 25c, the surface of the film 25c is planarized, and the microbump electrodes 30 are formed.

On the other hand, the output layer 10' is fabricated using a SOI substrate comprising the Si substrates 11 and 81. Specifically, the switching MOS transistors M are formed in the respective element-formation regions in the surface of the substrate 11 by a known method. The wiring films 31' are formed and then, the transistors M and the wiring films 31' are covered with the insulator film 13. After the conductive plugs 18 are formed in the film 13, the surface of the film 13 is planarized. Thereafter, the microbump electrodes 17 are formed.

Here, although the switching transistors M are not formed in the element-formation regions in the case of FIG. 8 (i.e., in the first embodiment), the switching transistors M are formed in the output layer 10' according to the third embodiment. In addition, when an amplifier circuit or a signal processing circuit is mounted, other MOS transistors may be fabricated in addition to the switching transistors M as necessary.

Subsequently, the substrates 21 and 71 having the structure for the light-receiving element layer 20" fabricated in the above-described way and the substrates 11 and 81 having the structure for the output layer 10' are glued together in such a way as to be opposed at their surfaces where the transistors M and M' are formed. When gluing, as shown in FIG. 15, the microbump electrodes 30 located on the surface of the substrate 21 having the structure for the light-receiving element layer 20" and the microbump electrodes 17 located on the surface of the substrate 11 having the structure for the output layer 10' are contacted to be opposed to each other. Then, the electrodes 30 and 17 are joined together by partially welding them. The adhesive 61 is filled into the gap between the insulator film 25c on the substrate 21 and the insulator film 13 on the substrate 11, thereby fixing them together.

Following this, by polishing or etching, the substrate 71 for the light-receiving element layer 20" and the insulator film 27 are completely removed, and the substrate 21 is partially removed from its back surface to be sufficiently thinned to a thickness where desired reception of light is possible.

In the same way as shown in FIGS. 4 to 7, the interlayer insulator film 26 is formed on the back surface of the thinned substrate 21. The microlenses 43 and the Al film 44 are formed on the interlayer insulator film 26 thus formed. The single-crystal Si plate 41 is adhered onto the Al film 44 with the adhesive layer 45.

Subsequently, the substrate 81 on the side of the substrate 11 having the structure for the output layer 10' is completely removed by polishing or etching, thereby exposing the insulator film 12 and the lower ends of the plugs 15. The microbump electrodes 16 are respectively formed on the exposed ends of the plugs 15.

Finally, in the same way as shown in FIG. 12, the cavity 42 and the supporting wall 50 are formed and the quartz glass 51 serving as the cap is attached, thereby forming the light-introducing layer 40. Thus, the structure of FIG. 15 is obtained.

Since the solid-state image sensor 1B according to the third embodiment of the invention comprises the above-described structure, it goes without saying that the same advantages as those of the image sensor 1A according to the second embodiment are obtainable.

With the sensor 1B of the third embodiment, as explained above, light is irradiated to the light-receiving MOS transistors (phototransistors) M' from the opposite side to their gate electrodes 24. Therefore, the sensor 1B is different from the sensor 1 of the first embodiment at this point.

With the sensor 1B of the third embodiment, photodiodes may be used instead of the phototransistors M'. If so, light is irradiated to the photodiodes by way of the Si substrate in which the said photodiodes are formed. Thus, the sensor 1B is different from the sensor 1A of the second embodiment at this point.

An interposer may be provided instead of the output layer 10' in the above-described third embodiment as well.

Fourth Embodiment

Figure 16:
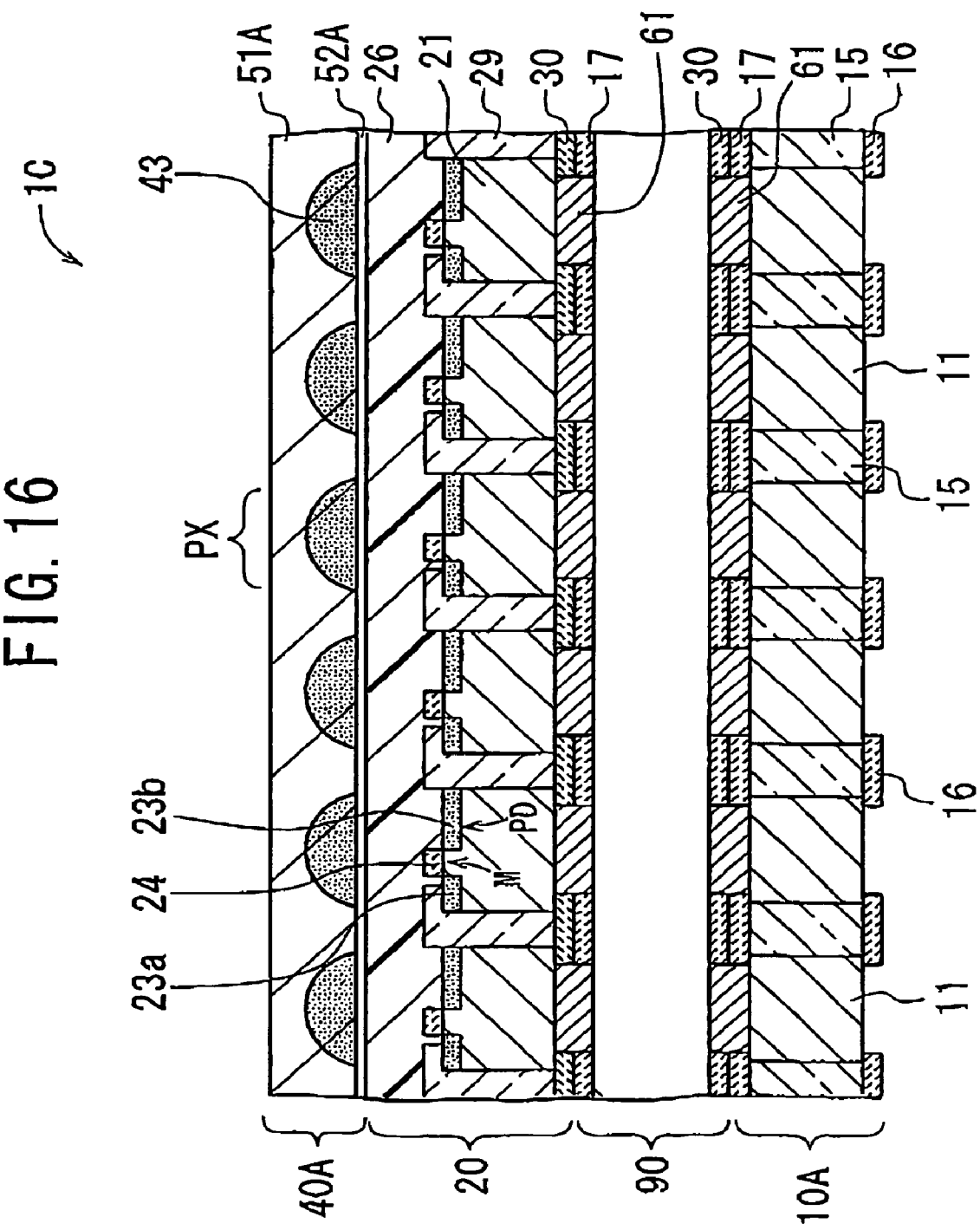
FIG. 16 is an enlarged cross-sectional view showing a main part of a solid-stage image sensor according to a fourth embodiment of the invention.

FIG. 16 shows the configuration of a solid-state image sensor 1C according to a fourth embodiment of the invention.

Unlike the above-described first to third embodiments, the sensor 1C does not have a cavity in the light-introducing layer 40A. A semiconductor element layer 90 in which predetermined semiconductor elements (not shown) are incorporated is provided between the light-receiving element layer 20 and the interposer 10A. These semiconductor elements are electrically connected to the electrodes 30 formed on the upper and lower surfaces of the layer 90 as necessary. The other configuration is the same as the first embodiment and thus, explanation about them are omitted.

As shown in FIG. 16, the light-introducing layer 40A in the fourth embodiment comprises a light-transmissive body, i.e., a plate-shaped, light-transmissive cap 51A, and the microlenses 43 formed in the cap 51A to be unified with the same and arranged on the light-transmissive regions of the light-receiving element layer 20 corresponding to the pixel regions PX. As apparent from FIG. 16, no cavity is present in the cap 51A. The cap 51A is formed by any light-transmissive plate such as a quart plate.

Next, a method of fabricating the solid-state image sensor 1C according to the fourth embodiment having the above-described structure is explained below with reference to FIGS. 17 and 18.

Figure 17:
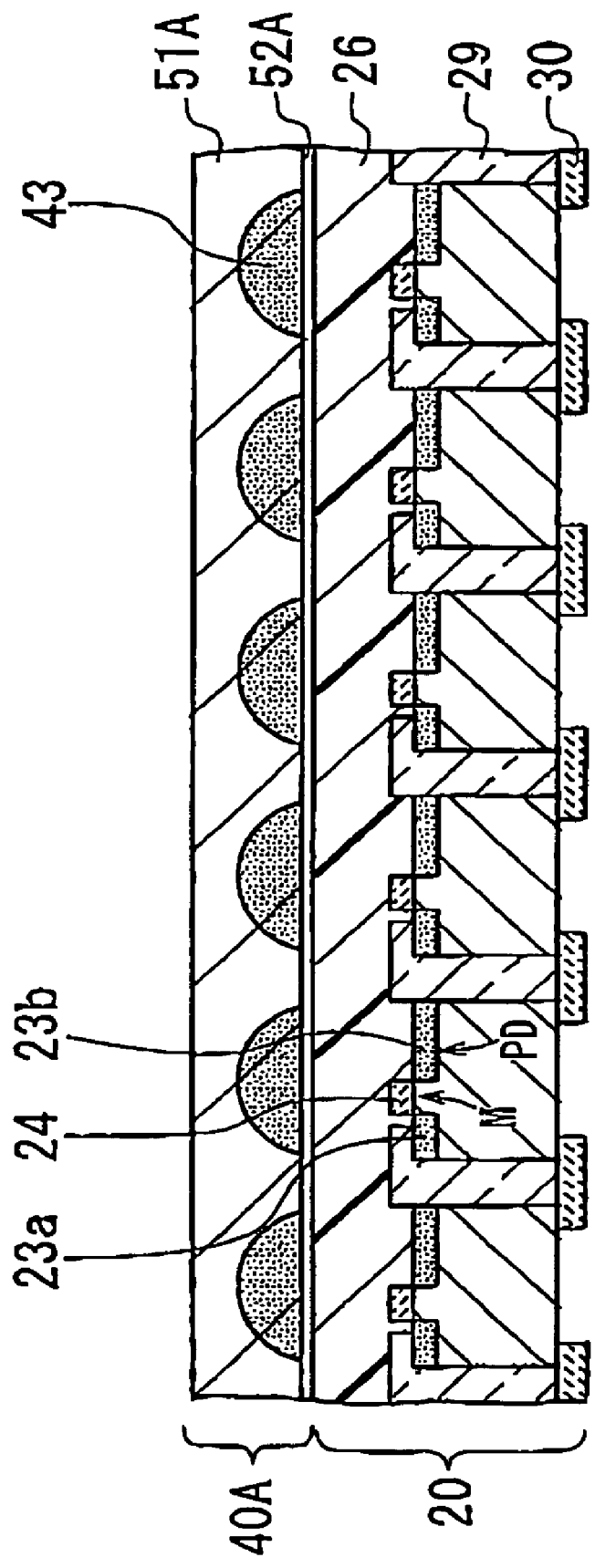
FIG. 17 is a view showing the process steps of a method of fabricating the image sensor according to the fourth embodiment of FIG. 16.
Figure 18:
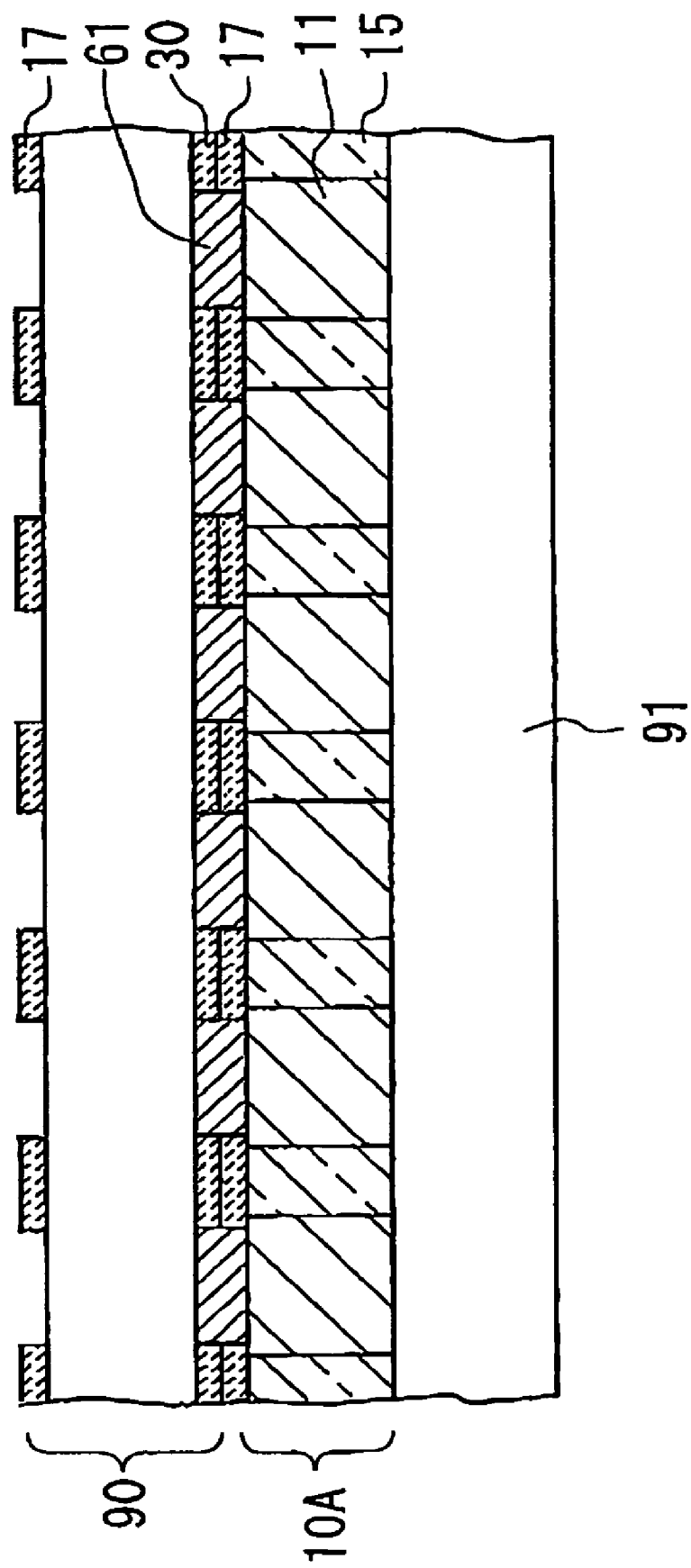
FIG. 18 is a view showing the process steps of the method of fabricating the image sensor according to the fourth embodiment of FIG. 16, which is subsequent to the step of FIG. 17.

First, in the same way as the first embodiment, the light-receiving element layer 20 having the structure shown in FIG. 17 is obtained. The detailed structure of the layer 20 shown in FIG. 17 is the same as that of FIG. 3 except that the electrodes 30 are formed on the lower surface of the layer 20.

Moreover, the microlenses 43 are formed in the light-transmissive cap 51A made of a quartz plate or the like by a known method. For example, one surface of a quartz plate is selectively removed by etching in such a way as to describe arcs in cross section, thereby forming depressions. Thereafter, an appropriate material for lens is filled into the respective depressions. Thus, the cap 51A having the microlenses 43 buried therein is obtained.

Thereafter, the cap 51A thus obtained is fixed onto the surface of the light-receiving element layer 20. At this time, the cap 51A and the layer 20 are positioned on the respective light-transmissive regions in such a way that the microlenses 43 are superposed on the corresponding pixel regions PX. The electrodes 30 are then formed on the lower surface of the layer 20. The state at this stage is shown in FIG. 17.

The interposer 10A is fabricated in the same way as used for forming the output layer 10 in the first embodiment. The semiconductor element layer 90 can be fabricated in the same way as used for forming the light-receiving element layer 20 in the first embodiment. Subsequently, the layer 90 is placed on the interposer 10A and fixed thereto with the adhesive 61. The state at this stage is shown in FIG. 18.

Finally, on the semiconductor element layer 90 fixed on the interposer 10A (see FIG. 18), the light-receiving element layer 20 on which the cap 51A is fixed (see FIG. 17) is fixed with the adhesive 61. In this way, the solid-state image sensor 1C according to the fourth embodiment shown in FIG. 16 is obtained.

The image sensor 1C according to the fourth embodiment can be fabricated by another method described below. This method will be explained with reference to FIGS. 19 and 20.

The interposer 10A is fabricated in the same way as used for forming the output layer 10 in the first embodiment. The semiconductor element layer 90 is fabricated in the same way as used for forming the light-receiving element layer 20 in the first embodiment. Thereafter, the layer 90 is placed on the interposer 10A and fixed thereto with the adhesive 61. The process steps so far are the same as the above-described fabrication method using FIGS. 17 and 18. Subsequently, a supporting substrate (e.g., a quartz plate) 92 is fixed to the upper surface of the layer 90 with an ultraviolet-decomposing adhesive 93 and then, the electrodes 16 are formed on the lower surface of the interposer 10A. The step of forming the electrodes 16 is carried out while supporting the stacked structure of the interposer 10A and the layer 90 by the supporting substrate 92. The state at this stage is shown in FIG. 19.

Subsequently, predetermined ultraviolet rays are irradiated to the cured ultraviolet-decomposing adhesive 93; then, the adhesive 93 is chemically decomposed. As a result, the supporting substrate 93 can be easily separated from the semiconductor element layer 90 without badly affecting the neighborhood. Then, the electrodes 17 are formed on the surface of the layer 90. The stat at this stage is shown in FIG. 20.

On the other hand, the stacked structure of the interposer 10A and the light-receiving element layer 20 is formed in the same way as explained above using FIGS. 17 and 18. The stacked structure of the interposer 10A and the layer 20 is placed on the stacked structure of the semiconductor element layer 90 and the interposer 10A shown in FIG. 20. Then, the adhesive 61 is filled into the gap between the structures and cured in the state where the opposing electrodes 17 and 30 are contacted with each other, thereby fixing them together. In this way, the image sensor 1C according to the fourth embodiment shown in FIG. 16 is obtained.

Any other adhesive may be used instead of the ultraviolet-decomposing adhesive 93. In this case, the supporting substrate 92 can be separated from the semiconductor element layer 90 by removing the adhesive layer by etching. Moreover, instead of the ultraviolet-decomposing adhesive 93, a sacrificial layer made of any other material such as an insulator is formed and then, the substrate 92 may be fixed to the layer 90 with the sacrificial layer. In this case, the substrate 92 can be separated from the layer 90 by removing the sacrificial layer by etching.

Although the interposer is provided in the fourth embodiment, it is needless to say that an output layer may be provided.

VARIATIONS

The above-described first to fourth embodiments are preferred examples of the present invention. It goes without saying that the invention is not limited to these embodiments and various modifications are possible.

For example, semiconductor elements or circuits for any signal processing other than amplification may be formed in the light-receiving element layer 20 or the output layer 10. Semiconductor elements or circuits for any signal processing may be formed in a separate layer, where the separate layer is located between the light-receiving element layer 20 and the output layer 10. Further, one or more other layer or layers may be added between the layers 20 and 10.

As explained above, with the present invention, a solid-state image sensor which has a so-called chip-size package and which can be easily fabricated without extra sophisticated technologies is obtainable. A sufficiently high operation speed (e.g., an operating frequency in the order of GHz) satisfying the recent demand of raising the signal processing rate is obtainable. Various circuits such as amplifier circuits for electric input signals and a signal processing circuit can be incorporated into the sensor according to the necessity. As a result, a high-speed, high-sensitivity, high-performance, microminiaturized solid-state image sensor is obtainable.

The invention claimed is:

1. A solid-state image sensor including pixel regions arranged regularly on its face, comprising:
   (a) a light-receiving element layer, which is formed by using a semiconductor substrate, including
      semiconductor light-receiving elements, which are arranged corresponding to the pixel regions, for generating electric signals according to light irradiated; and
      light-transmissive regions for enabling light to be irradiated to the semiconductor light-receiving elements;
   (b) a light-introducing layer for introducing light to the semiconductor light-receiving elements of the light-receiving element layer by way of the light-transmissive regions; and
   (c) an output layer or interposer, which is formed by using a semiconductor substrate, having output terminals for outputting the electric signals generated by the semiconductor light-receiving elements of the light-receiving element layer;
   wherein the light-introducing layer includes
   (b-1) microlenses arranged on the light-transmissive regions of the light-receiving element layer corresponding to the pixel regions;
   (b-2) a supporting wall, which is formed on or over the light-transmissive regions, for forming a cavity accommodating the microlenses; and
   (b-3) a light-transmissive cover fixed to the supporting wall to form the cavity;
      wherein the sensor is configured in such a way that external light introduced into the cavity by way of the cover is irradiated to the semiconductor light-receiving elements of the light-receiving element layer by way of the microlenses;
      wherein the light-receiving element layer, the light-introducing layer, and the output layer or interposer constitute a three-dimensional stacked structure;

wherein at least one of the light-receiving element layer and the output layer or interposer comprises holes for electrical connection, the holes penetrating through the semiconductor substrate;

wherein the supporting wall comprises a multiple-layer structure comprising a first part located at a position adjacent to the light-receiving element layer and a second part located adjacent to the first part;

wherein the first part comprises a material forming a protector or etch stop for the microlenses to protect the microlenses when forming the cavity, and wherein the first part is selectively removable without deleterious affect to the microlenses during or after formation of the cavity; and wherein the second part is disposed to adhere the cover to the first part.

2. A sensor according to claim 1, wherein each of the microlenses of the light-introducing layer is island-shaped.

3. A sensor according to claim 1, wherein the microlenses are located on the surface of the light-transmissive regions of the light-receiving element layer.

4. A sensor according to claim 1, wherein the supporting wall of the light-introducing layer includes a rigid material fixed to the surfaces of the light transmissive regions with an adhesive.

5. A sensor according to claim 1, wherein the light-receiving element layer, or the output layer, or the interposer includes at least one semiconductor element that deals with the electric signals generated by the light receiving elements.

6. A sensor according to claim 1, wherein at least one of a photodiode, a phototransistor, and a MOS transistor is included as the light-receiving element of the light-receiving element layer.

7. A sensor according to claim 1, wherein the output layer or the interposer has interconnections buried in a semiconductor substrate; and
the electric signals generated by the semiconductor light-receiving elements of the light-receiving element layer are sent to the output terminals of the output layer or the interposer by way of the buried interconnections.

8. A sensor according to claim 1, wherein the light-transmissive regions of the light-receiving element layer are formed by an insulating film.

9. A sensor according to claim 1, wherein the light-transmissive regions of the light-receiving element layer are formed by an insulating film and a semiconductor substrate.

10. A sensor according to claim 1, further comprising a signal-processing layer provided between the light-receiving element layer and the output layer or the interposer, where the signal-processing layer includes a signal processing circuit for applying a predetermined signal processing to the electric signals generated by the semiconductor light-receiving elements.

11. A solid-state image sensor including pixel regions arranged regularly on its face, comprising:
(a) a light receiving element layer, which is formed by using a semiconductor substrate, including
semiconductor light-receiving elements, which are arranged corresponding to the pixel regions, for generating electric signals according to light irradiated; and
light-transmissive regions for enabling light to be irradiated to the semiconductor light-receiving elements;
(b) a light-introducing layer for introducing light to the semiconductor light-receiving elements of the light-receiving element layer by way of the light-transmissive regions; and (c) an output layer or interposer, which is formed by using a semiconductor substrate, having output terminals for outputting the electric signals generated by the semiconductor light-receiving elements of the light-receiving element layer;

wherein the light-introducing layer includes
(b-1) a light-transmissive body; and
(b-2) microlenses formed in the body to be unified with the same and arranged on the light-transmissive regions of the light-receiving element layer corresponding to the pixel regions;

wherein the sensor is configured in such a way that external light introduced into the inside of the body is irradiated to the semiconductor light-receiving elements of the light-receiving element layer by way of the microlenses;

wherein the light-receiving element layer, the light-introducing layer, and the output layer or interposer constitute a three-dimensional stacked structure;

wherein at least one of the light-receiving element layer and the output layer or interposer comprises holes for electrical connection, the holes penetrating through the semiconductor substrate;

wherein the microlenses have tops and the microlenses are disposed in the body so that the body has no internal cavity and the tops of the microlenses do not reach the surface of the body; and wherein the surface of the body is flat.

12. A sensor according to claim 11, wherein the microlenses are located on the surfaces of the light-transmissive regions of the light-receiving element layer.

13. A sensor according to claim 11, wherein the light-receiving element layer, or the output layer, or the interposer includes at least one semiconductor element that deals with the electric signals generated by the light-receiving elements.

14. A sensor according to claim 11, wherein at least one of a photodiode, a phototransistor, and a MOS transistor is included as the light-receiving element of the light-receiving element layer.

15. A sensor according to claim 11, wherein the output layer or the interposer has interconnections buried in a semiconductor substrate;
and the electric signals generated by the semiconductor light-receiving elements of the light-receiving element layer are sent to the output terminals of the output layer or the interposer by way of the buried interconnections.

16. A sensor according to claim 11, wherein the light-transmissive regions of the light-receiving element layer are formed by an insulating film.

17. A sensor according to claim 11, wherein the light-transmissive regions of the light-receiving element layer are formed by an insulating film and a semiconductor substrate.

18. A solid-state image sensor according to claim 11, further comprising a signal-processing layer provided between the light-receiving element layer and the output layer, where the signal-processing layer includes a signal processing circuit for applying a predetermined signal processing to the electric signals generated by the semiconductor light-receiving elements.

19. A sensor according to claim 1, wherein the wall comprises a four-layer structure.

* * * * *